US 8,066,367 B2

(12) United States Patent
Nakajima et al.

(10) Patent No.: US 8,066,367 B2
(45) Date of Patent: Nov. 29, 2011

(54) DROP COATING APPARATUS

(75) Inventors: Yoshinori Nakajima, Nara (JP); Kaoru Higuchi, Tenri (JP); Toshihiro Tamura, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 467 days.

(21) Appl. No.: 12/226,496

(22) PCT Filed: Apr. 16, 2007

(86) PCT No.: PCT/JP2007/058259
§ 371 (c)(1),
(2), (4) Date: Dec. 5, 2008

(87) PCT Pub. No.: WO2007/123077
PCT Pub. Date: Nov. 1, 2007

(65) Prior Publication Data
US 2010/0165065 A1 Jul. 1, 2010

(30) Foreign Application Priority Data
Apr. 19, 2006 (JP) ................. 2006-115488

(51) Int. Cl.
*B41J 2/01* (2006.01)
(52) U.S. Cl. ..................... 347/104; 347/101
(58) Field of Classification Search .......... 347/104, 347/101, 37, 2, 103; 414/781, 784
See application file for complete search history.

(56) References Cited

U.S. PATENT DOCUMENTS

| 4,628,238 A * | 12/1986 | Smulders et al. ............ 318/653 |
| 2003/0189604 A1 * | 10/2003 | Bae et al. ...................... 347/37 |
| 2004/0250760 A1 * | 12/2004 | Goto ........................... 118/300 |
| 2006/0050106 A1 | 3/2006 | Kojima |
| 2006/0088700 A1 * | 4/2006 | Miyasaka ................ 428/195.1 |
| 2009/0040269 A1 * | 2/2009 | Nakajima et al. ............. 347/37 |

FOREIGN PATENT DOCUMENTS

| EP | 1972385 A1 | 9/2008 |
| JP | 05-041596 A | 2/1993 |
| JP | 2003-066218 A | 3/2003 |
| JP | 2003-191462 A | 7/2003 |
| JP | 2003-225606 A | 8/2003 |
| JP | 2004-298727 A | 10/2004 |
| JP | 2004-337707 A | 12/2004 |
| JP | 2005-013994 A | 1/2005 |
| JP | 2005-288412 A | 10/2005 |

OTHER PUBLICATIONS

European Search Report of Jan. 5, 2010 in EP07741695.6 corresponding to PCT/JP2007058259.

* cited by examiner

*Primary Examiner* — Manish S Shah
(74) *Attorney, Agent, or Firm* — Edwards Angell Palmer & Dodge LLP; David G. Conlin; David A. Tucker

(57) ABSTRACT

A droplet applying apparatus includes a base having a mounting surface on which a substrate is to be mounted, an arm part which is fitted to the base so as to be movable relative to the base in an arrow A direction, and a plurality of droplet ejecting sections which are fitted to the arm part so as to be movable in an arrow B direction and which eject droplets to the substrate mounted on the mounting surface. The droplet ejecting sections are fitted on a fitting surface of a first beam member of the arm part as well as on a fitting surface of a second beam member of the arm part.

4 Claims, 23 Drawing Sheets

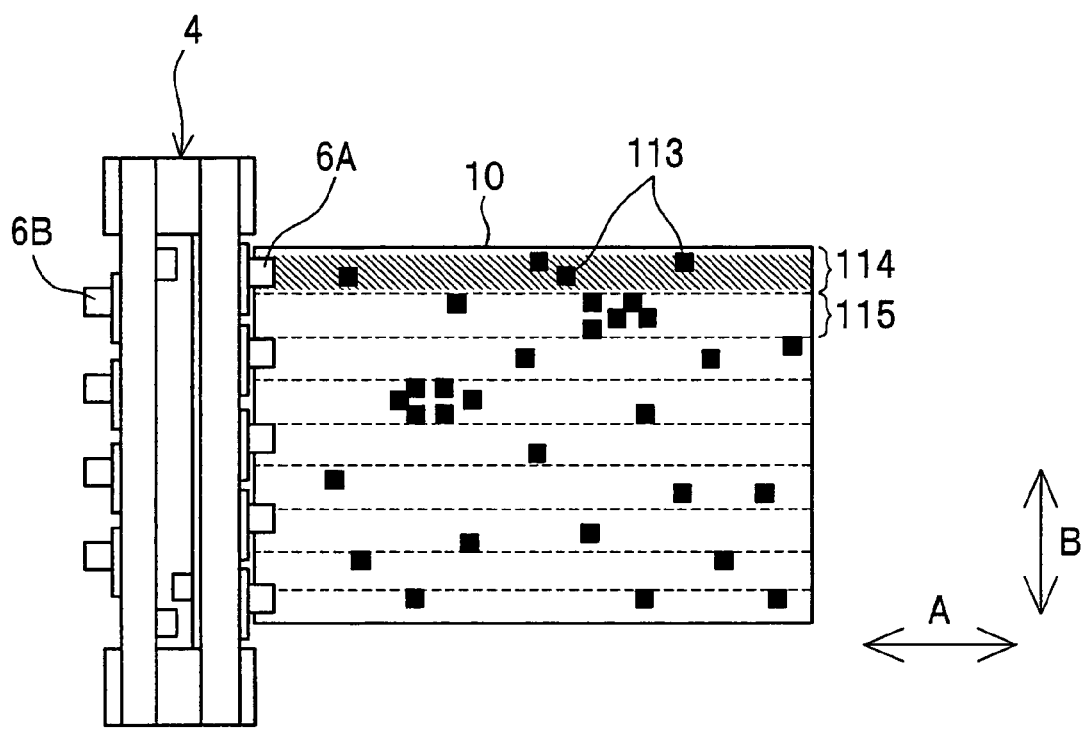

DROP COATING APPARATUS

TECHNICAL FIELD

The present invention relates to a droplet applying apparatus for applying droplets onto a substrate by an ink jet system or the like.

BACKGROUND ART

In recent years, the ink jet technology has been expected for use as manufacturing apparatuses, not merely as printer devices for forming images on paper mediums. For example, in JP 2003-191462 A, an apparatus construction in which droplet ejecting elements using the ink jet system are mounted is disclosed as a manufacturing apparatus for liquid crystal displays, organic EL displays, plasma displays, electron emission elements, electrophoretic display devices and the like. For improvement of landing position precision onto the substrate, in JP 2003-191462 A, a stage for carrying the substrate in one fixed direction with an apparatus base body provided by a granite surface plate, and a carriage mechanism for moving an ink jet head along a direction perpendicular to the stage traveling direction, are provided on the granite surface plate in direct connection.

A general-use printer by the ink jet system, typically, forms images by using one ink jet head unit on which several pieces of ink jet head elements each having a width of ½ to 2 inches and having nozzle openings regularly arrayed at intervals of 150 to 300 nozzles/inch are mounted as elements for ejecting droplets in some plural quantity for each of the individual colors. As the method therefore, it has been practiced that recording sheet, while fed by a sheet feed roller, is scanned a plurality of times in a direction perpendicular to the carrying direction of the recording sheet so that an image is formed on the recording sheet.

Even with the use of the ink jet system as a manufacturing apparatus, the ink jet head elements are similar to those of general-purpose printers, the size of each ink jet head element in the nozzle array direction being 1 to 2 inches at most as it stands.

Meanwhile, manufacturing processes for liquid crystal displays, organic EL displays, plasma displays, electron emission elements and electrophoretic display devices are increasingly directed toward increasing the yield quantity by using larger-area substrates to reduce the cost and the cycle time. Manufacturing of these devices and others by the ink jet system would require an apparatus that is capable of managing large-area substrates having one side as much as several meters.

One of manufacturing apparatuses using the ink jet system capable of high-speed processing with large-area substrates is a line head system in which a plurality of ink jet head elements are arrayed to a length more than the substrate size. This system is so configured that at most 1 to 2-inch wide ink jet elements are staggered to an extent equal to the substrate size, in which case at least 100 to 200 heads need to be arrayed on condition that the substrate is several-meter sized. Apparatuses by this system can be said to be quite effective in cases where ejection to all over the substrate such as color filter substrates is required and moreover the ejection points are regularly located.

However, the line head system would be unsuitable for recovery of color filter substrates as shown in, for example, JP 2003-66218 A. JP 2003-66218 A shows a system which includes, as part of the manufacturing method of color filter substrates, ejecting a color filter material only to failure points on occurrence of coloring failure portions in the color filter substrate. Using the line head system as a means for correcting such failure points scattered on the color filter substrate would involve the same processing time as in the ejection of droplets to all over the substrate, and moreover cause most of the nozzles to be non-operating nozzles that perform almost no ejecting operation, leading to a high likelihood of occurrence of nozzle clogging. Further, maintenance operation would be required for all the nozzles, leading to increases in unnecessary waste fluids. Also, with a desire for uniformized ejection quantity, the line head system would give rise to a need for performing ejection quantity correction on a total of thousands of nozzles, one by one, despite the purpose of merely ejecting droplets to scattered desired points, hence extremely inefficient.

Further, in a system in which the ink jet head unit that has been widely used in general-purpose printers is reciprocated in plurality on one identical plane, the scanning distance of the ink jet head units is increased, and the scanning speed is also limitative in terms of stable operation, so that the processing time could not be shortened.

Furthermore, the desire for efficiently ejecting droplets to desired points without limitation to all over large-area substrates is what will be sought in the future not only for recovery of color filters but in various manufacturing fields.

With the ink jet system used as a manufacturing apparatus, there would be a need that the retaining member for retaining the head across the substrate be elongated to 2 to 4 m according as color filter substrates get bigger in area. However, it is hard to manufacture longer retaining members with high precision, and the impossibility of obtaining a high-precision retaining member would cause a fear that the precision of droplet landing positions for the substrate may be worsened.

DISCLOSURE OF THE INVENTION

Accordingly, an object of the present invention is to provide a droplet applying apparatus which is capable of efficiently applying droplets to specified portions (e.g., coloring failure portions) of the substrate and moreover improving the precision of droplet landing positions for the substrate.

In order to attain the above object, there is provided a droplet applying apparatus comprising:

a base having a mounting surface on which a substrate is to be mounted;

at least one beam member which confronts the mounting surface and extends in one direction of the mounting surface and which is fitted to the base so as to be movable relative to the base in the other direction of the mounting surface; and a plurality of droplet ejecting sections which are fitted to the beam member so as to be movable in the one direction and which eject and apply droplets to the substrate, wherein the beam member has a plurality of flat surfaces extending in the one direction, and the droplet ejecting sections are fitted on one flat surface out of the plurality of flat surfaces.

In the droplet applying apparatus of this invention, since the droplet applying apparatus includes a beam member movable relative to the base and the plurality of droplet ejecting sections movably fitted to the beam member, it becomes implementable, in the application of droplets to specified portions (e.g., coloring failure portions) of the substrate by the droplet ejecting sections, to execute the droplet application by moving the beam member or the droplet ejecting sections, so that the droplets can be applied to the specified portions of the substrate with high efficiency.

Also, the quantity of the droplet ejecting sections can be reduced to a necessary minimum, so that the quantity of non-operating droplet ejecting sections can be cut down. Accordingly, clogging of the droplet ejecting sections by droplets can be prevented, the liquid quantity of waste fluid due to the maintenance operation of the droplet ejecting sections can be reduced, and moreover the ejection quantity of all the droplet ejecting sections can be uniformized.

The beam member has the plurality of flat surfaces extending in the one direction, and the droplet ejecting sections are fitted on one flat surface out of the plurality of flat surfaces. Therefore, it becomes easy to obtain high positional precision of the one flat surface relative to the mounting surface, so that the precision of droplet landing positions of the droplet ejecting sections relative to the substrate can be improved.

In one embodiment, a plurality of the beam members are provided so as to be arrayed side by side in the other direction, and the plurality of beam members are integrally coupled together so as to be integrally movable relative to the base in the other direction.

In the droplet applying apparatus of this embodiment, since the plurality of the beam members are provided so as to be arrayed side by side in the other direction, the droplet ejecting sections that can be mounted on this apparatus can be increased in quantity, so that the processing time for the substrate can be shortened.

Also, since the plurality of beam members are integrally coupled together so as to be integrally movable relative to the base in the other direction, moving mechanisms for moving the beam members and the base relative to each other can be decreased in number. Moreover, vibrations (resonance) that may occur when the plurality of beam members are moved independently of one another relative to the base can be prevented, by which any shifts of droplet landing positions due to the vibrations can be prevented.

One embodiment further comprises an image pickup device which is placed between the neighboring beam members and fitted to at least one beam member of the neighboring beam members and which serves for picking up an image of the substrate mounted on the mounting surface.

In this case, the image pickup device, for example, picks up an image of the substrate for adjustment of the attitude of the substrate on the mounting surface, picks up an image of the substrate for correction of landing positions onto the substrate, or picks up an image of the substrate for observation of the landing state on the substrate.

In the droplet applying apparatus of this embodiment, the image pickup device fitted to the beam members is provided between the neighboring beam members. Therefore, the image pickup device can be positioned in a dead space between the neighboring beam members, and moreover no additional beam member needs to be provided for fitting of the image pickup device. Thus, the apparatus can be reduced in size.

In one embodiment, the number of beam members is two, and the two beam members are provided side by side in the other direction, each of the two beam members has two flat surfaces extending in the one direction and facing opposite sides in the other direction, respectively, and the droplet ejecting sections are fitted on one flat surface of one beam member opposite to the other flat surface confronting the other beam member as well as on one flat surface of the other beam member opposite to the other flat surface confronting the one beam member.

In the droplet applying apparatus of this embodiment, the droplet ejecting sections are fitted on the one flat surface of the one beam member opposite to the other flat surface confronting the other beam member as well as on the one flat surface of the other beam member opposite to the other flat surface confronting the one beam member. Therefore, the droplet ejecting sections are fitted on outer flat surfaces of the integrally coupled two beam members that are on the outer side in the other direction. Therefore, fitting and removal, maintenance, and other working processes of the droplet ejecting sections can easily be executed from the outer side of the two beam members.

According to the droplet applying apparatus of the invention, the droplet applying apparatus includes at least one beam member movable relative to a base and a plurality of droplet ejecting sections movably fitted to the beam member, and the droplet ejecting sections are fitted on one flat surface out of a plurality of flat surfaces formed on the beam member. Therefore, droplets can efficiently be applied to specified portions (e.g., coloring failure portions) of the substrate, and moreover the precision of droplet landing positions by the droplet ejecting sections onto the substrate can be improved.

BRIEF DESCRIPTION OF THE DRAWINGS

FIG. 8C is a function explanatory view showing a state that the substrate is carried in;

FIG. 17 is a function explanatory view showing an operation that droplets are ejected to the substrate by droplet ejecting sections;

DETAILED DESCRIPTION OF THE INVENTION

Hereinbelow, the present invention will be described in detail by embodiments thereof illustrated in accompanying drawings.

Figure 1A:
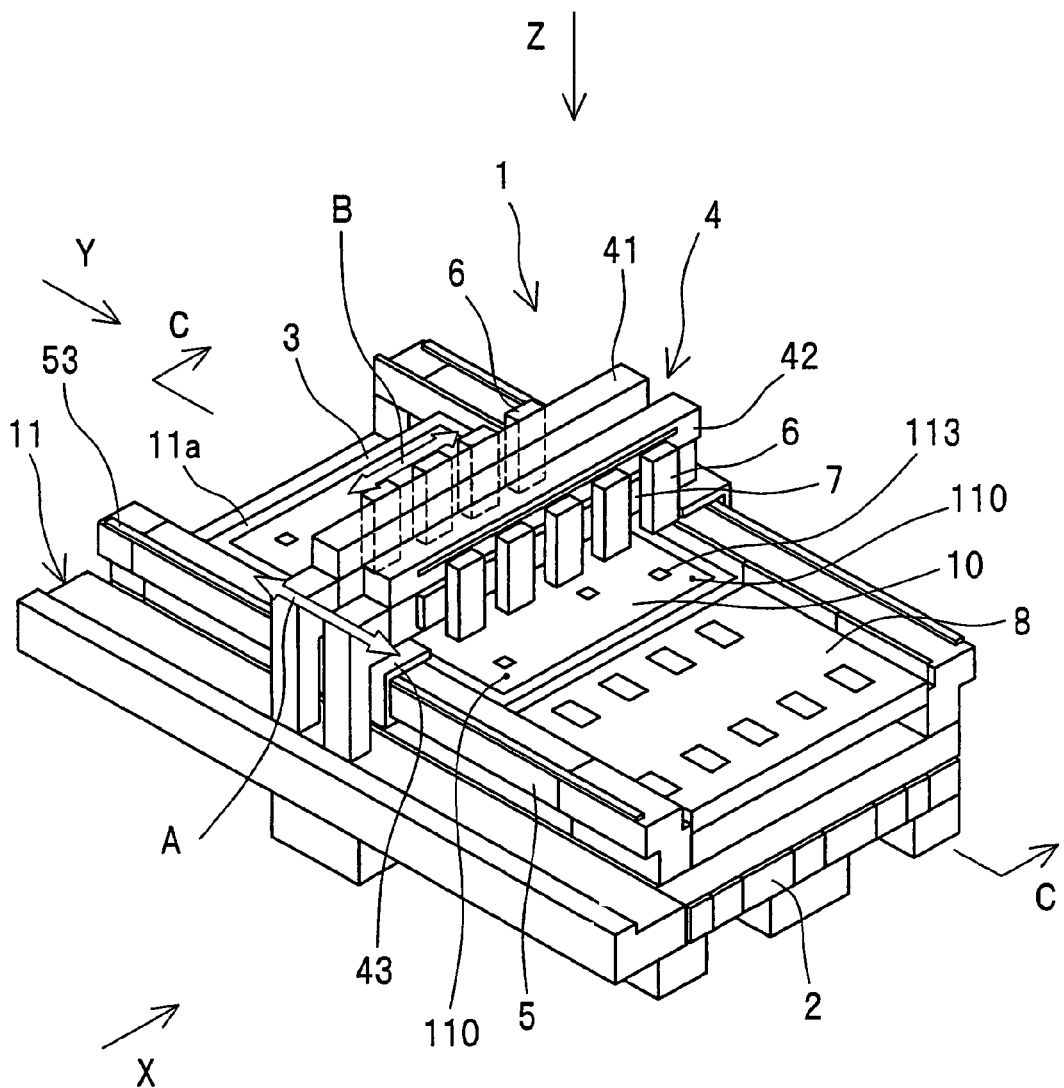
FIG. 1A is a perspective view showing an embodiment of a droplet applying apparatus of the present invention.
Figure 1B:
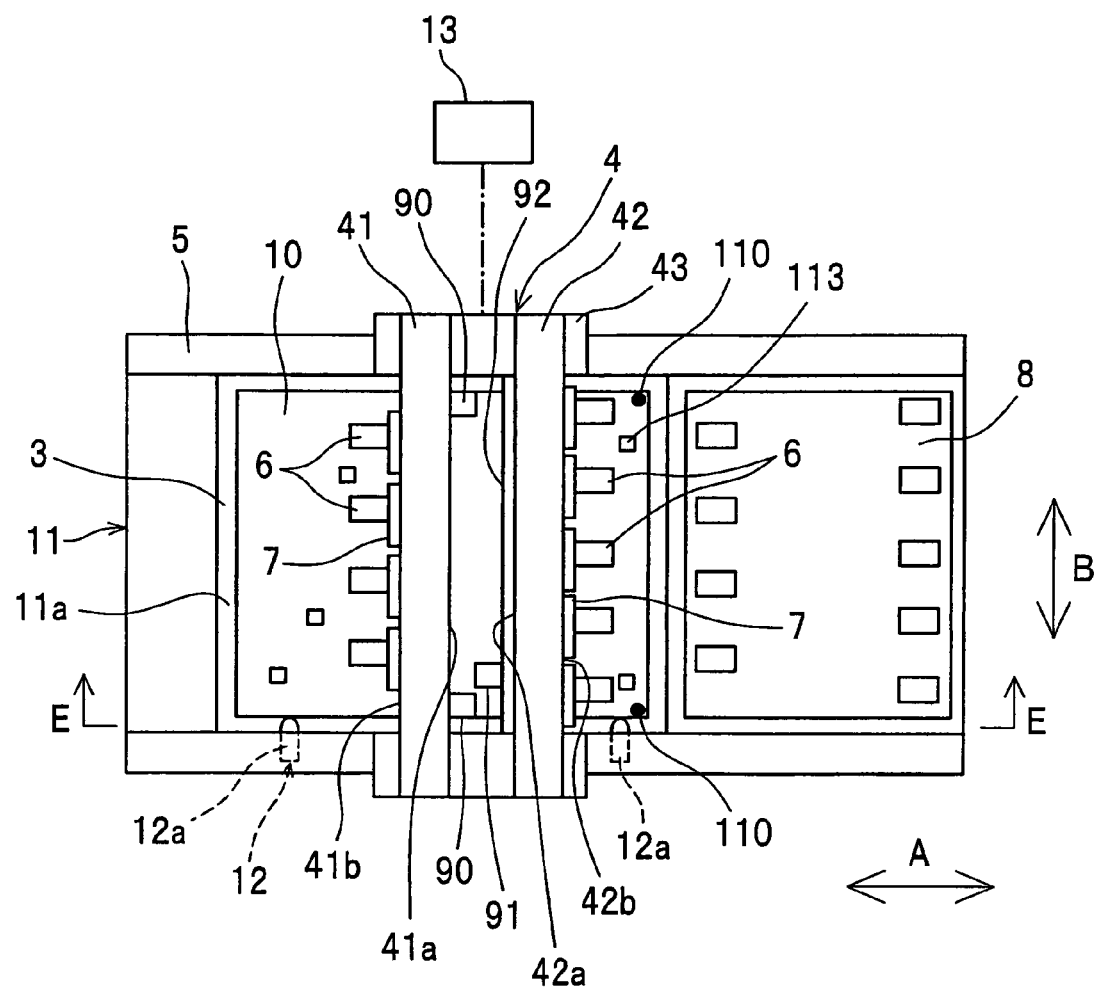
FIG. 1B is a plan view of the droplet applying apparatus.

FIGS. 1A and 1B are constructional views showing an embodiment of the droplet applying apparatus of the invention. The droplet applying apparatus 1 of the invention includes a base 11 having a mounting surface 11a on which a substrate 10 is to be mounted, an arm part 4 which is fitted to the base 11 so as to be movable relative to the base 11, and a plurality of droplet ejecting sections 6 which are movably fitted to the arm part 4 and which eject droplets to the substrate 10 mounted on the mounting surface 11a.

The substrate 10 is, for example, a color filter substrate to be used for liquid crystal displays or the like. The substrate 10 has defect portions 113 such as coloring failures. Two alignment marks 110 are formed near end faces of the substrate 10. The alignment marks 110 have only to be at least two in quantity.

The base 11 has a base body 2, and a mounting stage 3 which is mounted on the base body 2 and which moves in the carry-in and carrying of the substrate 10. That is, a top surface of the mounting stage 3 includes the mounting surface 11a.

The arm part 4, which is so set as to confront and stretch over the mounting surface 11a in one direction of the mounting surface 11a, is reciprocatively movable in the other direction of the mounting surface 11a. The one direction and the other direction are perpendicular to each other. The one direction refers to an arrow B direction, and the other direction refers to an arrow A direction.

In short, the arm part 4, which is a so-called gantry, is formed into an arch shape so as to cross the mounting stage 3 sideways. The arm part 4 can be reciprocatively moved in the arrow A direction by arm part moving mechanisms 5 provided on the base body 2.

More specifically, on the base body 2, the arm part moving mechanisms 5 extending in the arrow A direction are provided on both sides of the mounting stage 3 in the arrow B direction, respectively. The arm part 4 has levitative moving mechanisms 43 fitted to the arm part moving mechanisms 5, respectively, and a first beam member 41 and a second beam member 42 stretched over the two levitative moving mechanisms 43, 43, respectively. That is, the first beam member 41 and the second beam member 42 are integrally coupled together so as to be integrally movable in the arrow A direction.

The first beam member 41 and the second beam member 42 extend in the arrow B direction and confront the mounting surface 11a, being juxtaposed in the arrow A direction so as to be spaced from each other.

The first beam member 41 and the second beam member 42 have a plurality of flat surfaces extending in the arrow B direction, respectively. The droplet ejecting sections 6 are fitted on one flat surface out of the plurality of flat surfaces.

That is, the first beam member 41 and the second beam member 42 each have two surfaces which extend in the arrow B direction and which face toward mutually opposite sides in the arrow A direction. Then, slide mechanisms 7 for moving the droplet ejecting sections 6 along a direction (arrow B direction) different from the moving direction (arrow A direction) of the arm part 4 are mounted on one flat surface (fitting surface 41b) of the first beam member 41 opposite to the flat surface (confronting surface 41a) confronting the second beam member 42, as well as on one flat surface (fitting surface 42b) of the second beam member 42 opposite to the flat surface (confronting surface 42a) confronting the first beam member 41. The droplet ejecting sections 6 mounted on the slide mechanisms 7 are movable within movable ranges on the slide mechanisms 7, respectively, in the arrow B direction. The droplet ejecting sections 6 eject and apply droplets to specified portions of the substrate 10 such as the defect portions 113.

Four droplet ejecting sections 6 are mounted on the fitting surface 41b of the first beam member 41, and five droplet ejecting sections 6 are mounted on the fitting surface 42b of the second beam member 42, where totally nine droplet ejecting sections 6 are fitted to the slide mechanisms 7 independently of one another. Then, all of the droplet ejecting sections 6 are moved in the arrow B direction, independently of one another, on their respective slide mechanisms 7 based on control commands from the apparatus.

Each of the droplet ejecting sections 6, which has a head ejecting surface with an opening formed therein for ejection of droplets, the head ejecting surface being a surface generally parallel and closest to the mounting surface 11a, drops droplets from the head ejecting surface to the substrate 10 on the mounting surface 11a based on control commands from the apparatus.

Image pickup parts 90 as image pickup devices fitted to the first beam member 41 are provided so as to be placed between the first beam member 41 and the second beam member 42, and an observation camera 91 as an image pickup device fitted to the second beam member 42 is also provided.

The image pickup parts 90 pick up images of the substrate 10 to adjust the attitude of the substrate 10 on the mounting surface 11a. The image pickup parts 90, having a low-magnification mode and a high-magnification mode, detect the alignment marks 110 of the substrate 10 mounted on the mounting surface 11a. On the confronting surface 41a of the first beam member 41, the image pickup parts 90 are mounted on both end portions of the first beam member 41 in the arrow B direction, respectively.

The observation camera 91 picks up an image of the substrate 10 for correction of landing positions onto the substrate 10 or picks up an image of the substrate 10 for observation of landing state on the substrate 10. The observation camera 91 is mounted on the confronting surface 42a of the second beam member 42.

An attitude adjustment member 12 is provided on the base 11. The attitude adjustment member 12 adjusts the attitude of the substrate 10 mounted on the mounting surface 11a based on a detection result of the image pickup parts 90.

The attitude adjustment member 12 presses different two points on one end face of the substrate 10, as well as one point on the other end face of the substrate 10 perpendicular to its one end face, to thereby adjust the attitude of the substrate. That is, the attitude adjustment member 12 has pins 12a, 12a for pressing one end face of the substrate 10, and a pin (not shown) for pressing the other end face of the substrate 10.

A control section 13 for controlling movement of the arm part 4 is connected to the arm part 4. When the substrate 10 is mounted on the mounting surface 11a, the control section 13 moves the arm part 4 to move the image pickup parts 90 to specified positions relative to the mounting surface 11a and keep the image pickup parts 90 in a standby state. It is noted that the specified positions refer to, for example, positions for detecting the alignment marks 110 of the substrate 10.

On the base body 2, a maintenance mechanism 8 is provided in adjacency to the mounting stage 3. The maintenance mechanism 8 has a mechanism for capping the droplet ejecting sections 6 at their ejecting surfaces in a non-use mode, a mechanism for detecting failure ejection openings, a mechanism for recovering failure ejection openings, and the like. Then, in maintenance operation, the arm part 4 is moved to immediately above the maintenance mechanism 8 by the arm part moving mechanisms 5, so that various types of maintenance operations are performed on the droplet ejecting sections 6 by the maintenance mechanism 8.

Figure 2:
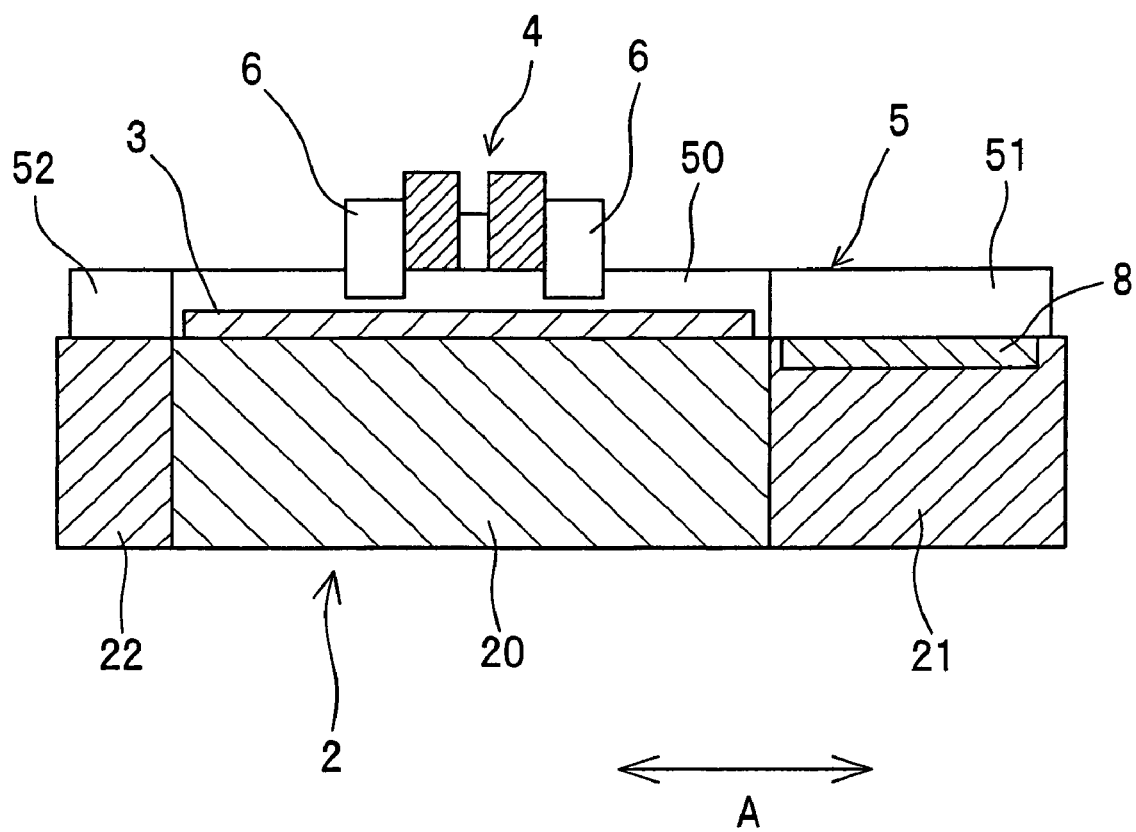
FIG. 2 is a sectional view taken along a line C-C of FIG. 1A.

As shown in FIG. 2, the base body 2 has a main stage 20 positioned in a center, and a first sub-stage 21 and a second sub-stage 22 positioned on both sides of the main stage 20 in the arrow A direction, respectively. It is noted that FIG. 2 is depicted with the substrate 10 omitted.

The first sub-stage 21 has the maintenance mechanism 8. The main stage 20, the first sub-stage 21 and the second sub-stage 22 are mechanically connected to one another.

The main stage 20, which is a high-precision stage made of granite, keeps the mounting stage 3 correctly fixed while droplets are being ejected from the droplet ejecting sections 6 toward the substrate 10 on the mounting stage 3.

The first sub-stage 21, on which the maintenance mechanism 8 is mounted, does not need to be manufactured at high precision, compared with the main stage 20.

The second sub-stage 22 is a stage to be used to move the mounting stage 3 to one end portion of the apparatus when the substrate 10 is carried in onto the mounting stage 3, or when the substrate 10 is carried out from on the mounting stage 3.

A main moving mechanism 50, a first sub-moving mechanism 51 and a second sub-moving mechanism 52 are mounted on the individual stages 20, 21, 22, respectively. The moving mechanisms 50, 51, 52 are connected to one another, with joints included therein, so that the arm part 4 is enabled to freely move over the moving mechanisms 50, 51, 52.

As shown in FIGS. 1A and 1B, the arm part 4 keeps normally air-levitated against the arm part moving mechanisms 5. That is, the arm part 4 is made movable by linear motor control between magnet type linear scales 53 provided on the arm part moving mechanisms 5 and the levitative moving mechanisms 43 of the arm part 4. It is noted that the arm part 4 is moved to an arbitrary position in the arrow A direction by the control section 13.

Then, the arm part moving mechanisms 5 and the magnet type linear scales 53 are continuously constructed, respectively, so as to be enabled to freely move over the three stages 20, 21, 22. It is noted that an unshown common vibration isolator is provided below the base body 2.

A plurality of unshown minute holes are formed in the top surface of the mounting stage 3. All of these holes are connected to an unshown suction mechanism, and the substrate 10 is sucked and fixed onto the mounting stage 3 by suction control with that suction mechanism, while the substrate 10 is released from on the mounting stage 3 by release control with the suction mechanism. The top surface of the mounting stage 3 is made of a granite surface plate having good flatness, being parallel to the ejecting surfaces of the droplet ejecting sections 6.

Figure 3:
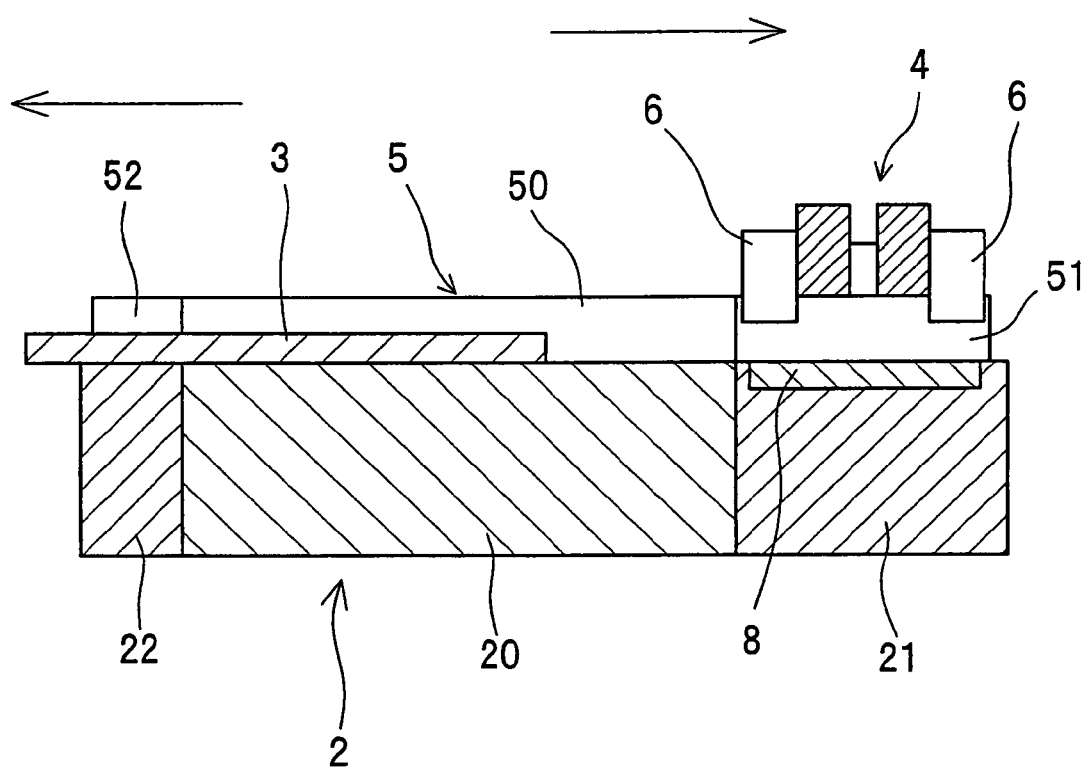
FIG. 3 is a function explanatory view of the droplet applying apparatus during carry-in or -out of a substrate.

The mounting stage 3, which is movable in the arrow A direction on unshown slide rails provided on the base body 2 by linear motor control, moves to an end portion farther from the maintenance mechanism 8 as shown in FIG. 3 when the substrate 10 is carried in or out. It is noted that the arm part 4 moves to just above the maintenance mechanism 8 when the substrate 10 is carried in or out.

Figure 4:
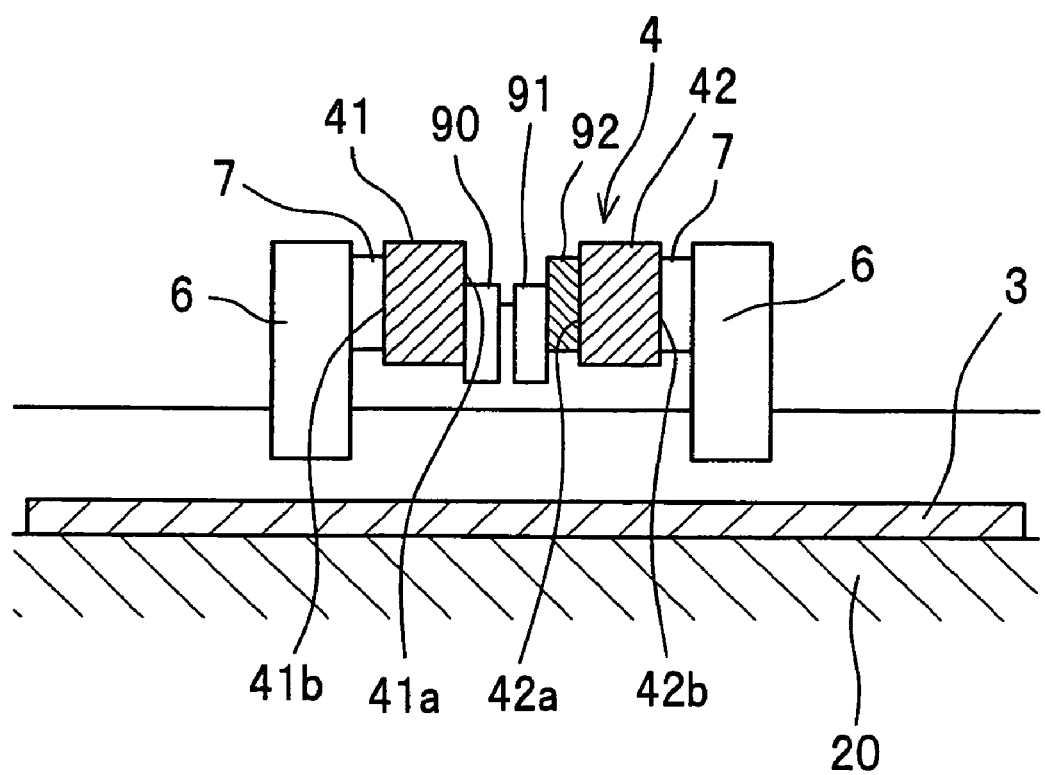
FIG. 4 is a sectional view taken along a line E-E of FIG. 1B.

As shown in FIGS. 1B and 4, four sets of the droplet ejecting sections 6 and the slide mechanism 7 are fitted on the fitting surface 41b of the first beam member 41. The two image pickup parts 90 are fitted on the confronting surface 41a of the first beam member 41.

Five sets of the droplet ejecting sections 6 and the slide mechanism 7 are fitted on the fitting surface 42b of the second beam member 42. A slide mechanism 92 having a width generally equal to the B-direction width of the mounting stage 3 is fitted on the confronting surface 42a of the second beam member 42. The observation camera 91 is movably fitted on the slide mechanism 92, the observation camera 91 being movable in the arrow B direction.

All of the slide mechanisms 7 are staggered in the arrow B direction as viewed from the top surface of the mounting stage 3. With regard to two slide mechanisms 7, 7 adjacent to each other in the arrow A direction, slidable areas of the two slide mechanisms 7, 7 partly overlap with each other with respect to the arrow B direction. The larger overlapping movable area is more preferable, desirably the overlapping ratio being one third or more.

Figure 5:
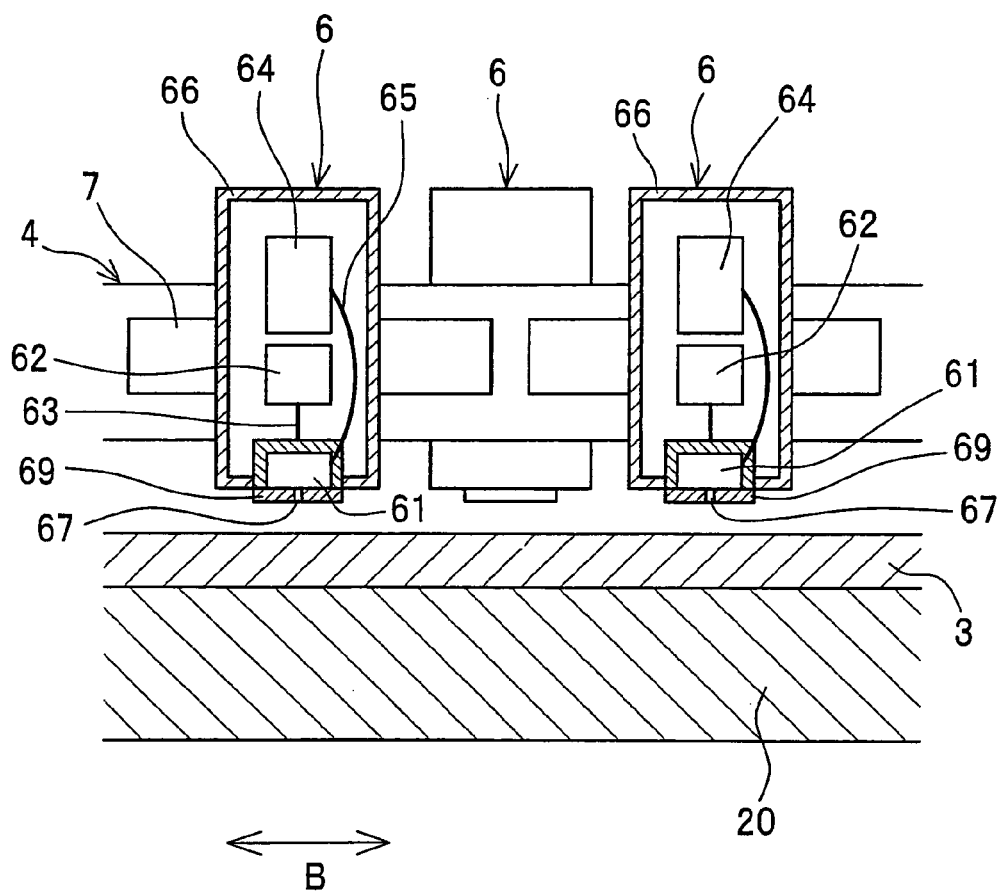
FIG. 5 is a partial sectional view as viewed in Y direction of FIG. 1A.

As shown in FIG. 5, the droplet ejecting sections 6, which are mounted on the slide mechanisms 7 set on the arm part 4, are movable in the arrow B direction independently of one another.

Each of the droplet ejecting sections 6 has a box frame 66, an ejecting element 61 housed in the box frame 66, a drive control circuit 62, an electric connection cable 63, an ink tank 64 and an ink tube 65. The box frame 66 moves on the slide mechanism 7.

A nozzle plate 69 is bonded to a surface of the ejecting element 61 parallel to the top surface of the mounting stage 3, and a plurality of nozzle openings 67 are formed in the nozzle plate 69. The diameter of each nozzle opening 67 is 10 μm to 20 μm.

The ejecting element 61 is such a common one that, for example, after recesses as a plurality of ink chambers are formed in a piezoelectric-material substrate, electrodes are formed at part of partition-wall side faces, in which arrangement an electric field is applied to between both side faces of the partition wall so that the partition wall itself is shear-deformed to generate ejection energy.

The drive control circuit 62 is connected to an unshown drive control system by an unshown cable to exert ejection control.

It is preparatorily arranged that with the substrate 10 mounted on the mounting stage 3, the distance between the droplet ejecting surface, which is the lowermost surface of the nozzle plate 69, and the top surface of the substrate 10 becomes 0.5 mm to 1 mm.

Figure 6:
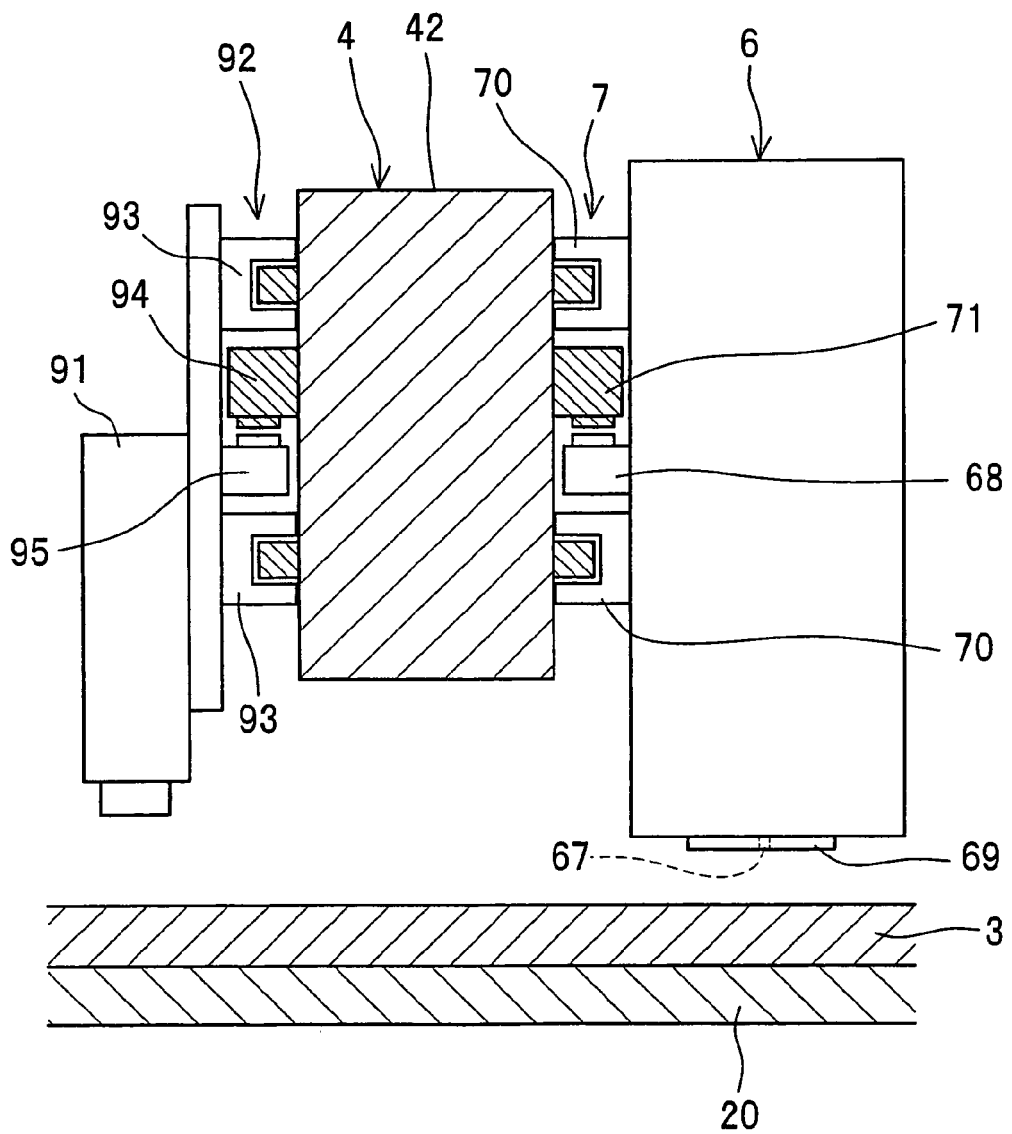
FIG. 6 is a partial sectional view as viewed in X direction of FIG. 1A.

As shown in FIG. 6, each of the slide mechanisms 7 fitted to the second beam member 42 and intended for the droplet ejecting sections 6 has two rows of LM guides 70, (made by THK Co., Ltd.) placed above and below, and a linear guide 71 placed between the two rows of LM guides 70, 70.

Part of each LM guide 70 is fitted to the droplet ejecting section 6, while the other part of the LM guide 70 is fitted to the second beam member 42. The part of the LM guide 70 and the other part of the LM guide 70 are slidable relative to each other.

The linear guide 71 is fitted to the second beam member 42. Drive control of a linear drive mechanism 68 that is fitted to the droplet ejecting section 6 so as to confront the linear guide 71 allows the droplet ejecting section 6 to be moved to a specified position at a near side or depth (in the arrow B direction in FIG. 1A) of the drawing sheet of FIG. 6.

The linear guide 71 is formed of miniature N-pole and S-pole permanent magnets arrayed alternately and regularly. The linear drive mechanism 68 is capable of freely generating N poles and S poles by AC control, making it possible to exert positional control of the droplet ejecting sections 6 on the slide mechanisms 7 by magnet force of the linear guide 71 and the linear drive mechanism 68.

An effective movement stroke of the LM guides 70 is 250 mm, and the linear guide 71 is set over a range more than this effective stroke. The slide mechanisms 7 fitted to the first beam member 41 are also similar in construction, and so its description is omitted.

As shown in FIG. 6, the slide mechanism 92 provided for use with the observation camera 91 and fitted to the second beam member 42, being similar in construction to the slide mechanisms 7, has two rows of LM guides 93, 93 (made by THK Co., Ltd.) placed above and below, and a linear guide 94 placed between the two rows of LM guides 93, 93.

Part of each LM guide 93 is fitted to the observation camera 91, while the other part of the LM guide 93 is fitted to the second beam member 42. The part of the LM guide 93 and the other part of the LM guide 93 are slidable relative to each other.

The linear guide 94 is fitted to the second beam member 42. Drive control of a linear drive mechanism 95 that is fitted to the observation camera 91 so as to confront the linear guide 71 allows the observation camera 91 to be moved to a specified position at a near side or depth (in the arrow B direction in FIG. 1A) of the drawing sheet of FIG. 6. The linear guide 94 and the linear drive mechanism 95 are similar in construction to the linear guide 71 and the linear drive mechanism 68, and so their description is omitted. The effective movement stroke of the LM guides 93 is 2500 mm, and the linear guide 94 is set over a range more than this effective stroke.

The observation camera 91 is enabled to output address information of the substrate 10 relative to the alignment marks 110 by an arrow-A-direction information acquisition function provided in the arm part moving mechanisms 5 as well as an arrow-B-direction information acquisition function provided in the slide mechanism 92.

The observation camera 91 is principally enabled to observe a landing image of landing on the substrate 10 by the droplet ejecting sections 6, and output ejection states of the respective droplet ejecting sections 6 or addresses of the landing positions on a basis of the alignment marks.

By using landing position coordinates acquired by the observation camera 91, correction of ejection timing in the arrow A direction is performed for the respective droplet ejecting sections 6, while correction of moving amounts of the slide mechanisms 7 in the arrow B direction is performed, by which droplets can be landed on desired positions on the substrate 10.

Figure 7A:
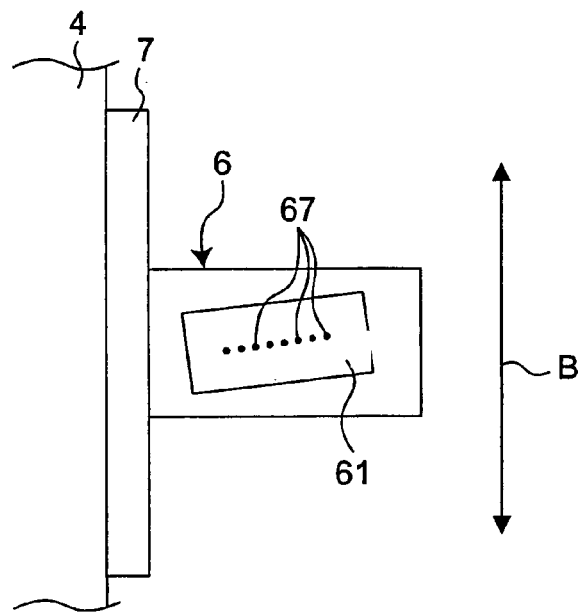
FIG. 7A is a bottom view of a droplet ejecting section.

As shown in the bottom view of FIG. 7A, each droplet ejecting section 6 has the ejecting element 61 for ejecting one kind of liquid. The nozzle openings 67 in the bottom face of the droplet ejecting section 6 are arrayed in one row, being inclined by a few degrees from perpendicularity with respect to the arrow B direction. The nozzle openings 67 all eject the same droplet material.

Figure 7B:
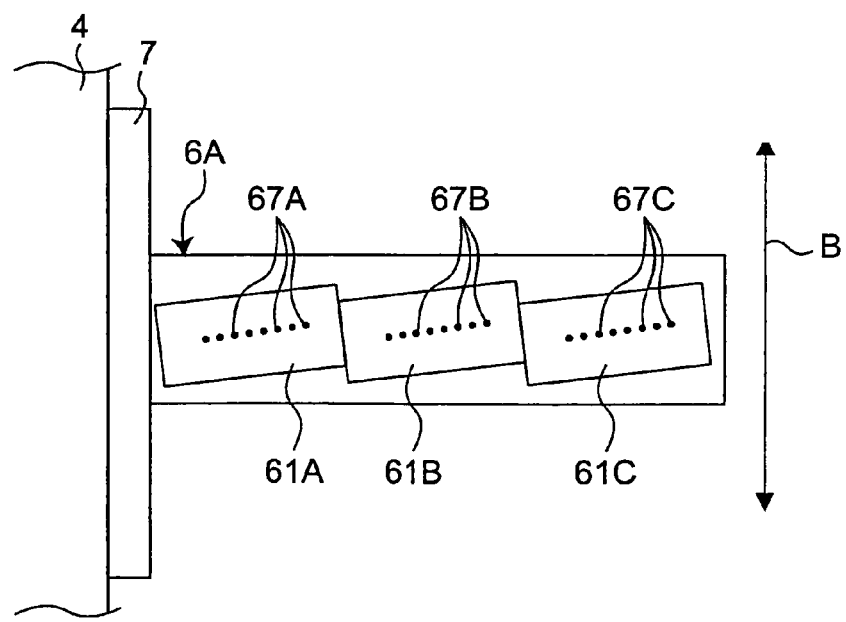
FIG. 7B is a bottom view of another droplet ejecting section.

The droplet ejecting section, as shown in FIG. 7B, may be a droplet ejecting section 6A having ejecting elements 61A, 61B, 61C for ejecting three kinds of liquids. That is, this droplet ejecting section 6A has the ejecting element 61A for ejecting a first droplet material, the ejecting element 61B for ejecting a second droplet material, and the ejecting element 61C for ejecting a third droplet material.

Nozzle openings 67A, 67B, 67C of the ejecting elements 61A, 61B, 61C, respectively, are inclined by a few degrees from perpendicularity with respect to the arrow B direction, and projection areas of the nozzle openings 67A, 67B, 67C, respectively, in the arrow B direction generally coincide with one another.

In addition, the nozzle openings 67A, 67B, 67C may be minutely movable in the arrow B direction within the droplet ejecting sections 6, respectively.

Next, operation of the droplet applying apparatus having the above-described construction is explained.

Figure 8A:
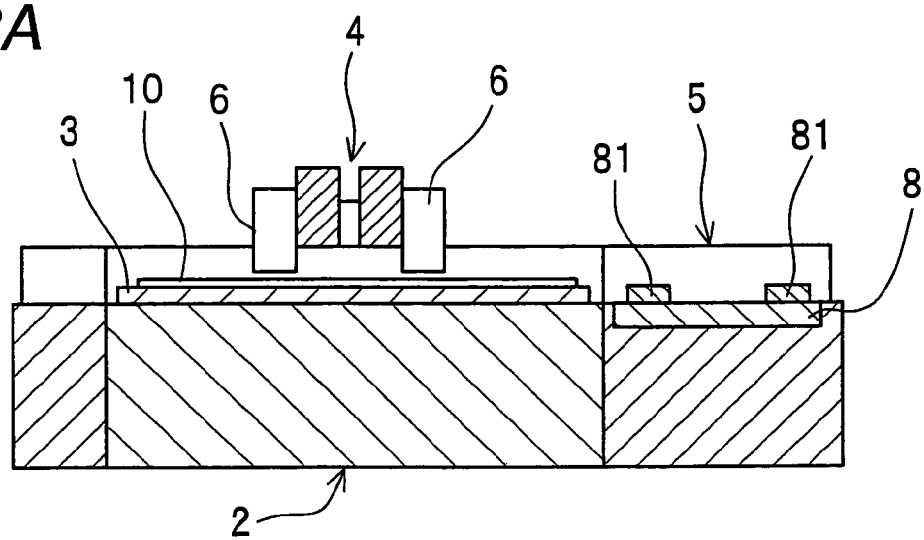
FIG. 8A is a function explanatory view showing a state at an end of substrate processing.
Figure 8B:
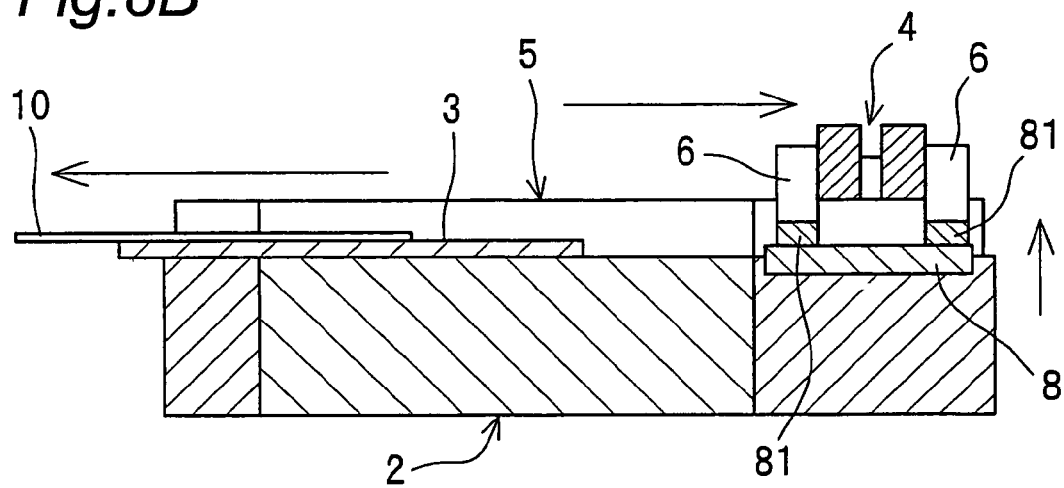
FIG. 8B is a function explanatory view showing a state that the substrate is carried out.
Figure 8C:
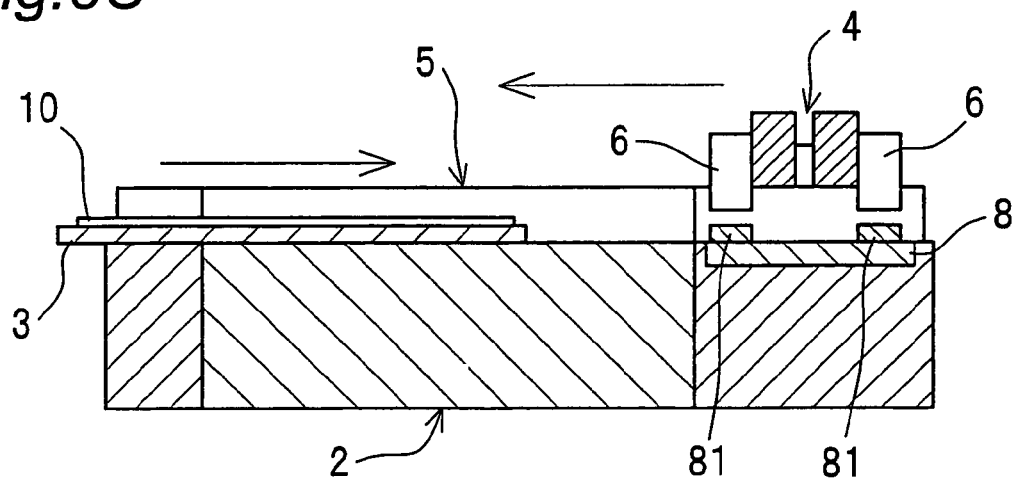

With reference to FIGS. 8A, 8B and 8C, carry-out and -in operation of the substrate 10 is described. As shown in FIG. 8A, the substrate 10 has been completely processed, and after the processing, the mounting stage 3, as shown in FIG. 8B, is slid leftward in the drawing sheet while the arm part 4 is moved to just above the maintenance mechanism 8. Then, after the suction of the processing-completed substrate 10 is released, the substrate 10 is delivered to an unshown transfer robot. Thereafter, the transfer robot mounts a next substrate 10 onto the mounting stage 3.

Then, the substrate 10 mounted on the mounting stage 3 is air sucked immediately to the mounting stage 3 as shown in FIG. 8C, and the mounting stage 3 and the arm part 4 are returned to their original positions as shown in FIG. 8A.

During the time duration from the carry-out of the substrate 10 from the mounting stage 3 to the carry-in of the next substrate 10 and further to the return of the mounting stage 3 to the original position, ordinary maintenance operation with the droplet ejecting sections 6 is performed in parallel.

In this maintenance operation, the arm part 4 is moved onto the maintenance mechanism 8, followed by maintenance work.

More specifically, a lower surface of the nozzle plate 69 of the droplet ejecting section 6 is capped with a rubber-made cap member 81 as shown in FIG. 8B. Then, vacuum suction is effected through an air hole provided in a bottom portion of the cap member 81, so that the liquid is forcedly discharged through the nozzle openings 67 of the nozzle plate 69, by which dust or the like of the nozzle openings 67 is removed.

Thereafter, the lower surface of the nozzle plate is wiped off by an unshown wipe blade. Then, the ejection state of the nozzle openings 67 is checked by an unshown non-ejection detecting mechanism. It is noted that the series of these maintenance operations may be done in a sequence different from the above-described one.

The mounting stage 3 on which the new substrate 10 is mounted, and the arm part 4 that has been completed with the maintenance operation of the droplet ejecting sections 6, are moved nearly simultaneously in the arrow directions of FIG. 8C so as to be returned to the positions of FIG. 8A.

Next, the maintenance operation for the droplet applying apparatus 1 is explained. While the carry-out/in of the substrate 10 is being executed, or while the droplet ejecting operation to the substrate 10 is kept out of execution for long periods, maintenance operation for the droplet ejecting sections 6 is executed. This maintenance operation includes non-ejection detection, capping, in-cap suction purge and wiping to be done.

In the case where the processing of the next substrate 10 is performed immediately after the processing of the foregoing substrate 10, simultaneously with a command for the carry-out operation of the foregoing substrate 10, the arm part 4 with the droplet ejecting sections 6 mounted thereon is given a command for movement to just above the maintenance mechanism 8.

The maintenance mechanism 8 has a non-ejection detecting mechanism for detecting ejection failures of the droplet ejecting sections 6. The non-ejection detecting mechanism is provided for each of the droplet ejecting sections 6.

Figure 9A:
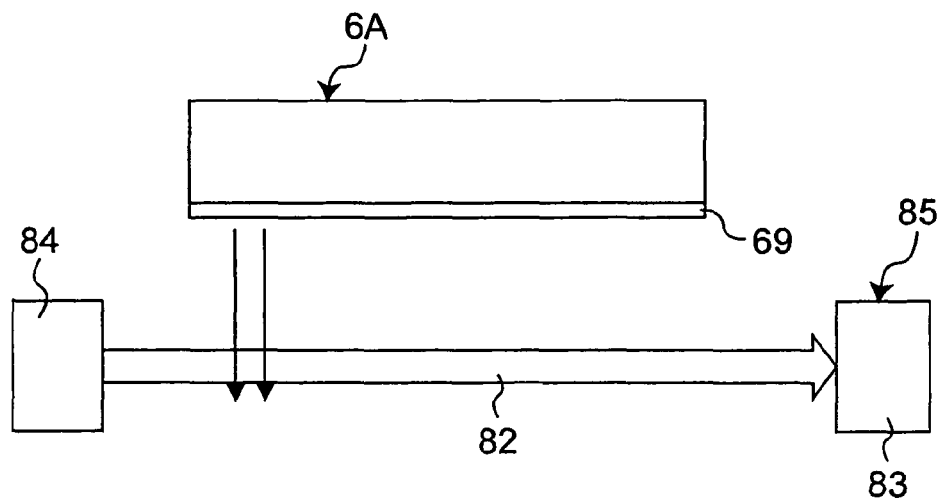
FIG. 9A is a side view of a non-ejection detecting mechanism.
Figure 9B:
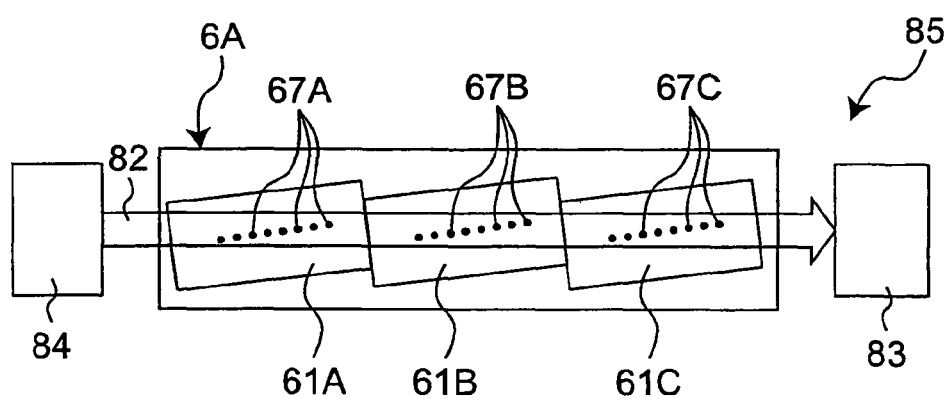
FIG. 9B is a bottom view of the non-ejection detecting mechanism.

As shown in FIGS. 9A and 9B, the non-ejection detecting mechanism 85 has a laser-light emitting element 84 and a laser-light receiving element 83. It is noted that the droplet ejecting section 6A shown in FIG. 7B is used as the droplet ejecting section.

The laser-light emitting element 84 and an unshown laser-light emitting circuit, upon receiving a command for non-ejection detection, emits a laser beam 82 continuously toward the laser-light receiving element 83. A received-light-quantity measuring means connected to the laser-light receiving element 83 stores therein an ordinary received light quantity.

The emission direction of the laser beam 82 is generally parallel to the top surface of the substrate 10 and generally parallel to the ejecting surface of the droplet ejecting section 6A (lower surface of the nozzle plate 69).

The diameter of the laser beam 82 is 1 mm, and droplets ejected from all the nozzle openings 67A, 67B, 67C of one droplet ejecting section 6A pass through within the optical axis of the laser beam 82.

The laser-light emitting element 84 and the laser-light receiving element 83 have a fine adjustment moving mechanism. This fine adjustment moving mechanism adjusts the positions of the laser-light emitting element 84 and the laser-light receiving element 83 in case that droplets do not pass through within the optical axis of the laser beam 82.

Operation of the non-ejection detecting mechanism 85 is explained below.

First, droplets are ejected from the first ejecting element 61A during a certain time period, after which a light quantity from the received-light-quantity measuring means is read and then compared with the ordinary received light quantity to measure an intercepted light quantity, followed by making a decision as to whether or not the measured value is within a range of set values that have preliminarily been set. If the measured value is within the range of set values, the ejection is regarded as a normal ejection, while if the measured value is not within the range of set values, the ejection is regarded as an ejection failure.

Next, for the second ejecting element 61B and the third ejecting element 61C, similar ejection control and intercepted-light-quantity measurement are performed in succession, by which the presence or absence of any ejection failure is checked for all the nozzle openings 67A, 67B, 67C of the droplet ejecting section 6A.

Without any ejection failure, the droplet ejecting section 6A is moved to the cap position, where capping is performed until the carry-in operation of the substrate 10 is almost completed.

With some ejection failure, commonly known recovery operation is performed in which, for example, the droplet ejecting section 6A is moved to the cap position and then capped, the cap being evacuated to effect forced discharge from the nozzle openings, followed by release of the cap, wiping and once more execution of non-ejection detection. Then, the non-ejection detection and the recovery operation are executed at most several times until the ejection failure is eliminated. If the ejection failure is not corrected, the result is outputted to the apparatus.

In addition, in a case where the comparison between the last non-ejection detection result immediately before the processing of the substrate 10 and the first non-ejection detection result executed during the carry-out of the substrate 10 yields recognition of a change in ejection state, the foregoing processing of the substrate 10 is regarded as inappropriate, and the substrate 10 may be discarded or passed to restoration process.

Next, alignment operation of the substrate 10 is explained.

Figure 10A:
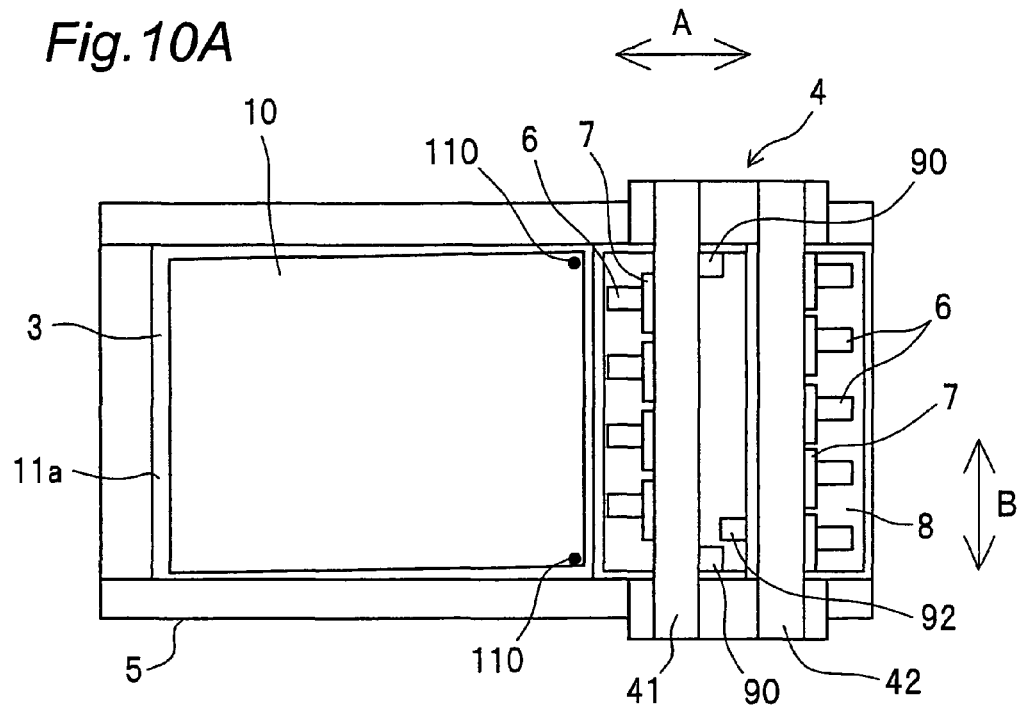
FIG. 10A is a function explanatory view showing substrate alignment operation.
Figure 10B:
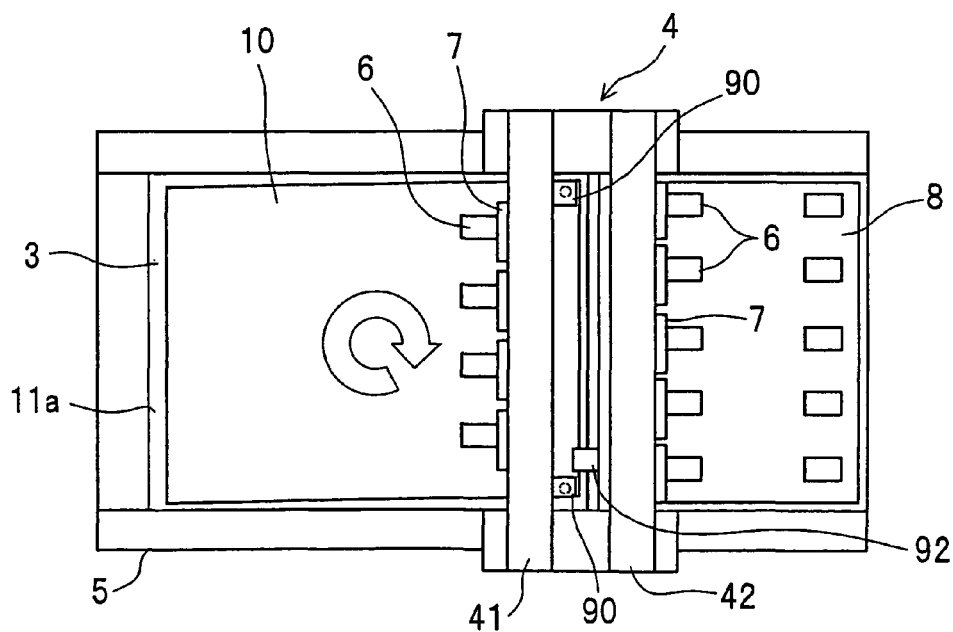
FIG. 10B is a function explanatory view showing substrate alignment operation.

The two image pickup parts 90, 90 fixed to the arm part 4 are moved integrally with the arm part 4 from the position of FIG. 10A to the position of FIG. 10B. Then, based on image information of the image pickup parts 90, the attitude of the substrate 10 is corrected to the arrow direction of FIG. 10B by the attitude adjustment member 12 shown in FIG. 1B.

On the substrate 10, the two alignment marks 110, 110 of high precision are preliminarily provided. The droplet application position of the substrate 10 is predetermined by referencing the alignment marks 110.

The alignment marks 110 are concentric marks, and a pitch difference between the two alignment marks 110, 110 is no more than 2 µm. The two image pickup parts 90, 90 are set on the arm part 4 with a pitch equal to the pitch of the two alignment marks 110, 110.

Also, the reference position of an image pickup part 90 and the landing position of a droplet ejecting section 6 are preliminarily corrected by correction operation with the observation camera 91.

Therefore, by achieving coincidence between the alignment mark 110 of the substrate 10 and the reference position of the image pickup part 90, the landing position of a droplet and the position to apply the droplet thereto can be made coincident with each other.

Figure 11:
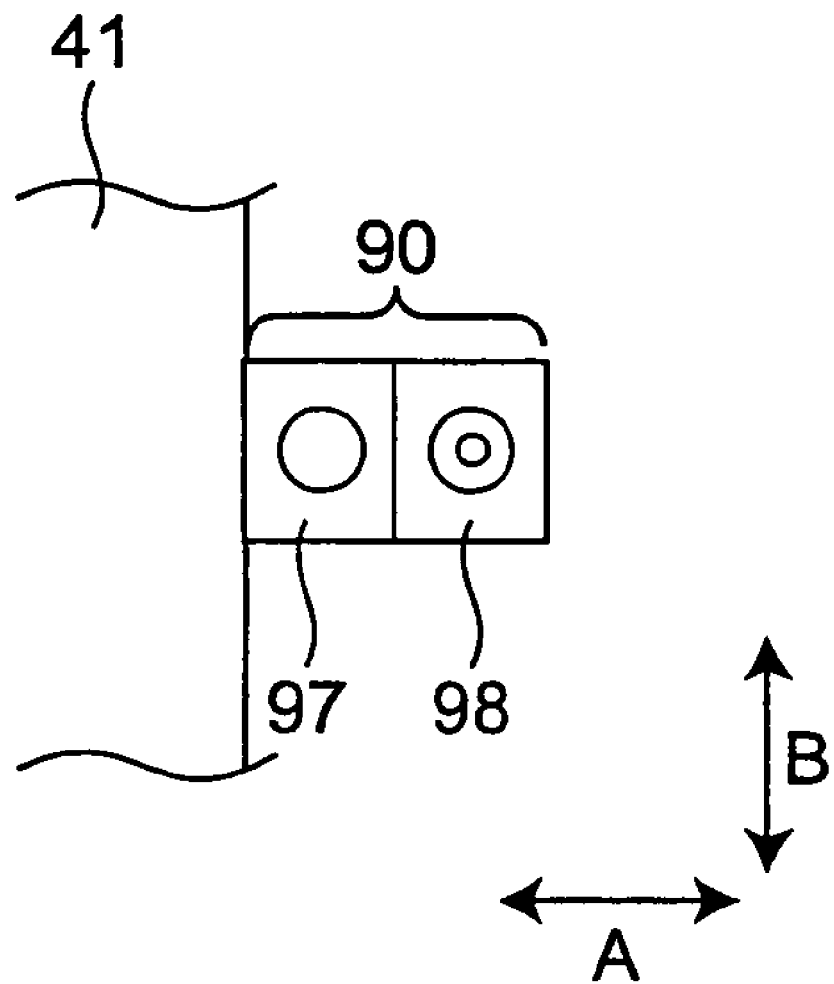
FIG. 11 is an enlarged bottom view of an image pickup part.

As shown in FIG. 11, the image pickup part 90 has a high-magnification mode camera unit 98 and a low-magnification mode camera unit 97. The high-magnification mode camera unit 98 and the low-magnification mode camera unit 97 are fitted to the arm part 4 side by side in the arrow A direction. That is, the low-magnification mode camera unit 97 and the high-magnification mode camera unit 98 are fitted in array to the first beam member 41 in this order.

The alignment reference position of the low-magnification mode camera unit 97 and the alignment reference position of the high-magnification mode camera unit 98 are preliminarily subjected to positional correction so as to be coincident with each other by properly moving the arm part 4.

The low-magnification mode camera unit 97 has a camera mechanism having a focus power of 0.5, thus enabled to pick up an image on the substrate 10 by a CCD camera of 2000000 pixels (1400×1400 pixels), where the image pickup field area is roughly 10 mm square and the image resolution is about 13 μm.

The high-magnification mode camera unit 98 has a camera mechanism having a focus power of 10, thus enabled to pick up an image on the substrate 10 by a CCD camera of 1400000 pixels (1400×1000 pixels), where the image pickup field area is roughly 0.5 mm square and the image resolution is about 0.7 μm.

The low-magnification mode camera unit 97 and the high-magnification mode camera unit 98 are connected to unshown image processing means, respectively.

In the image processing means, alignment mark images picked up by the camera units 97, 98 are binarized to determine a centroidal position of the marks, which is taken as a current alignment-mark center position.

Determining the alignment-mark center position by picking up images of the two alignment marks 110, 110 on the substrate 10 with the two camera units 97, 98 makes it possible to determine alignment quantities for rotational movement and linear movement of the substrate 10.

Figure 12:
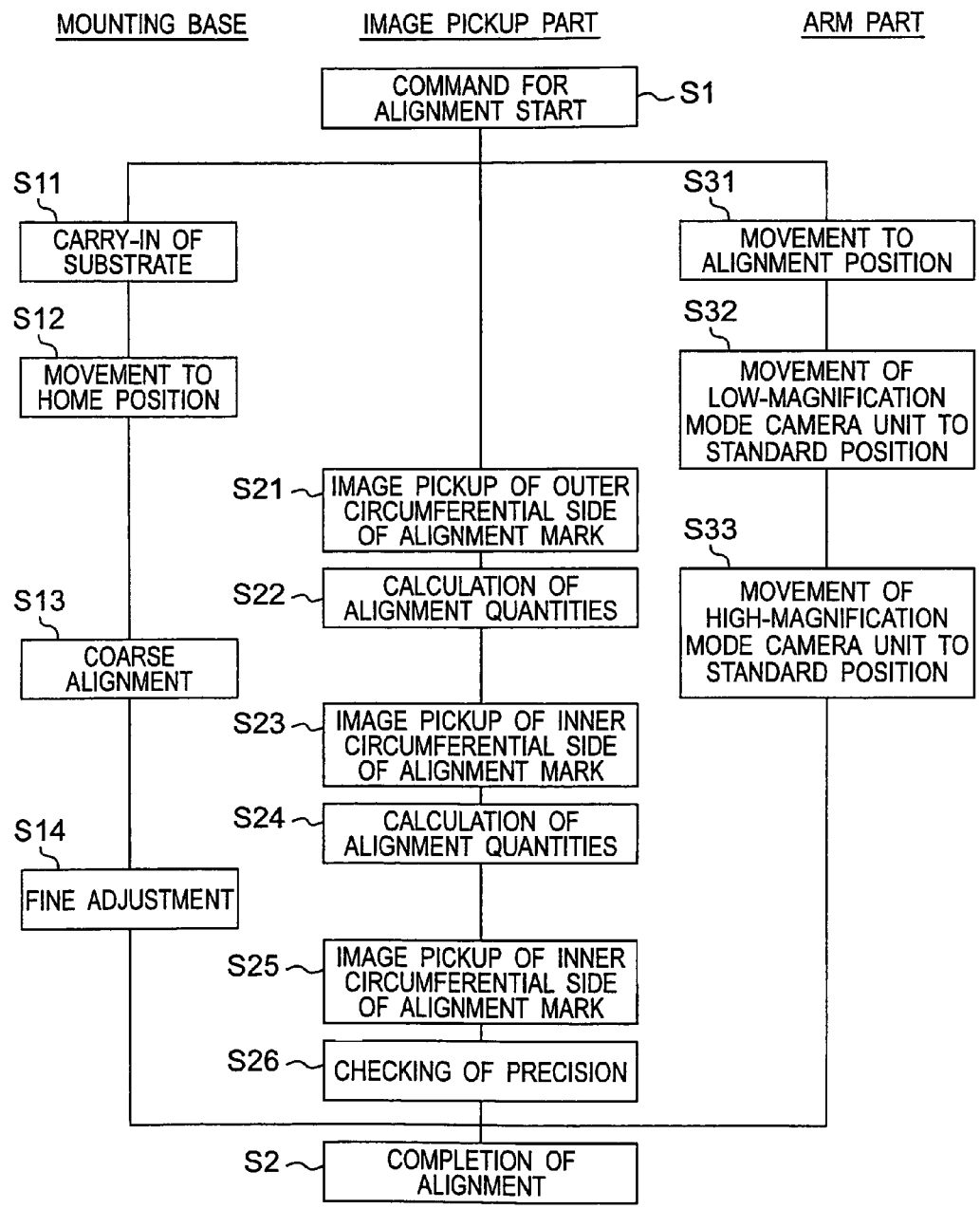
FIG. 12 is a flowchart showing the alignment operation.

FIG. 12 is a flowchart describing, in combination, movements of the mounting stage 3, the image pickup parts 90 and the arm part 4 with respect to the alignment operation.

When a command for alignment start is issued (S1), the unshown transfer robot mounts the substrate 10 onto the mounting stage 3 (S11), and the mounting stage 3 is moved to an alignment home position (S12).

During this operation, the arm part 4 is moved to the alignment position (S31) to move the low-magnification mode camera unit 97 to an alignment standard position where the alignment mark 110 of the substrate 10 is to be detected (S32).

Figure 13A:
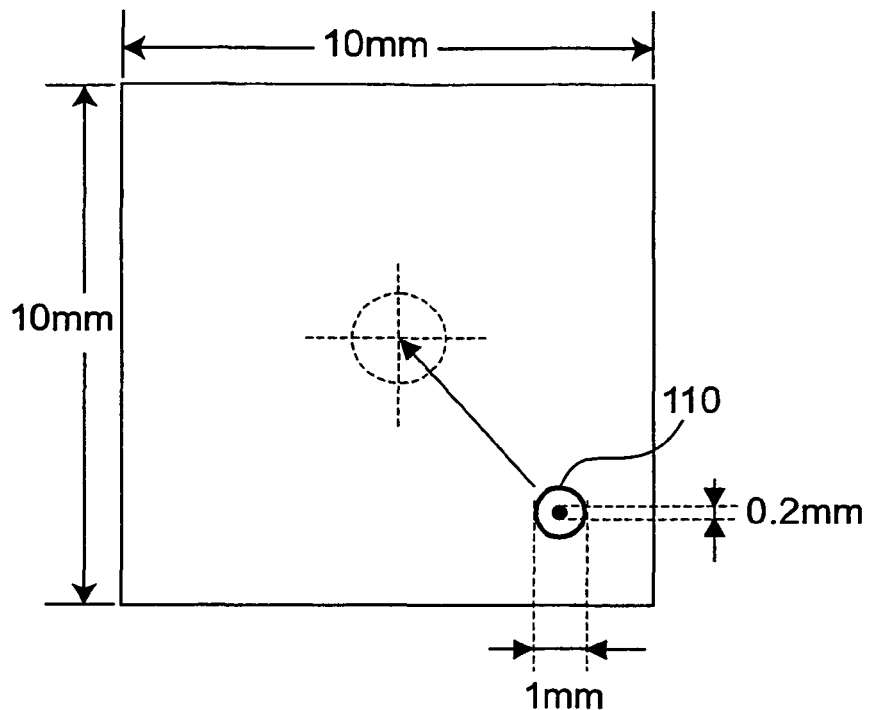
FIG. 13A is an explanatory view showing a field of view of a low-magnification mode camera unit in one image pickup part.
Figure 13B:
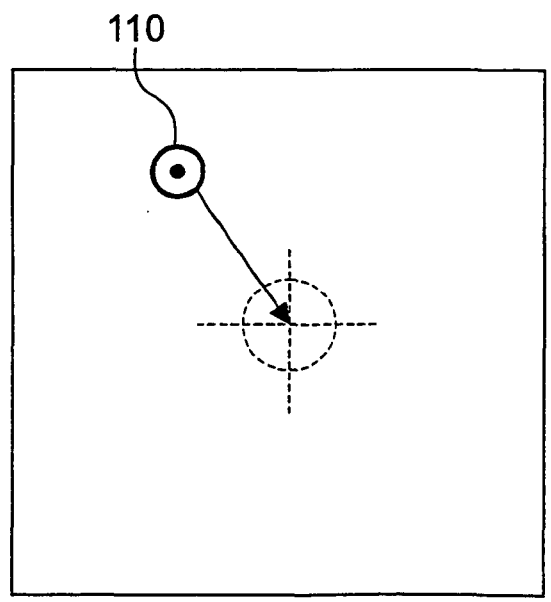
FIG. 13B is an explanatory view showing a field of view of a low-magnification mode camera unit in the other image pickup part.

In this connection, FIGS. 13A and 13B show fields of view of the low-magnification mode camera unit 97 resulting when the movements of the mounting stage 3 and the arm part 4 are completed. FIG. 13A shows a field of view of the low-magnification mode camera unit 97 of one image pickup part 90, and FIG. 13B shows a field of view of the low-magnification mode camera unit 97 of the other image pickup part 90.

The alignment mark 110 has a concentric shape, in which the outer ring for coarse alignment has an outer diameter of 1 mm, while the inner black dot for fine alignment has a diameter of 0.2 mm.

The precision with which the transfer robot mounts the substrate 10 onto the mounting stage 3 is ±3 mm from an ideal position. When the low-magnification mode camera unit 97 having a field area of 10 mm square is moved to the alignment standard position, the alignment mark 110 is necessarily contained in the field of view as shown in FIGS. 13A and 13B.

That is, the low-magnification mode camera unit 97 has a field of view more than the substrate-mounting precision of the transfer robot, thus making it possible to immediately execute alignment operation without performing preliminary alignment operation after the substrate mounting. Moreover, it is unnecessary to additionally provide any sequence or mechanism for searching the surroundings.

In short, the image pickup parts 90, in a low-magnification mode, each have enough field of view to detect the alignment mark 110 of the substrate 10 before the adjustment by the attitude adjustment member 12. Therefore, it is unnecessary to detect the alignment mark 110 before adjusting the attitude of the substrate 10 to make the alignment mark 110 contained in the field of view of the image pickup part 90, and moreover the alignment detection mechanism does not need to be additionally provided, and yet the time taken to adjust the attitude of the substrate 10 can be omitted.

Thereafter, as shown in FIG. 12, images of the alignment marks 110, 110 are picked up by the two low-magnification mode camera units 97, 97, respectively (S21), the centroidal position of the outer ring is read, and alignment quantities that are values by which the substrate 10 should be moved is calculated from deviated directions and deviation quantities of the two marks from their reference position (S22).

Also, at a time point when the image pickup of the alignment marks 110 is completed (S21), the arm part 4 is moved so that the high-magnification mode camera unit 98 is moved to the alignment standard position where the alignment marks 110 of the substrate 10 are to be detected (S33).

After the alignment quantities are determined (S22), coarse alignment of the substrate 10 is executed based on the above-acquired information by the attitude adjustment member 12 (S13).

It is noted here that the term, coarse alignment, refers to moving the alignment mark 110 to the alignment reference position indicated by dotted cruciform lines in FIGS. 13A and 13B.

Figure 14A:
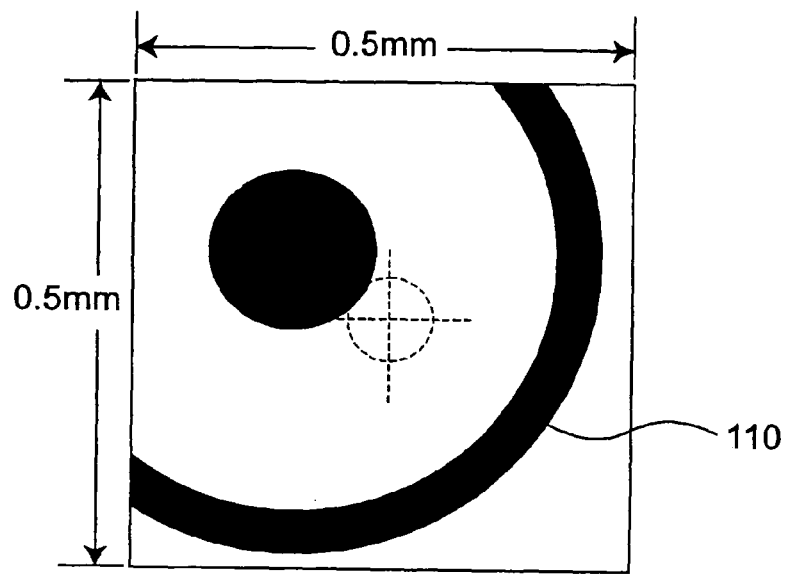
FIG. 14A is an explanatory view showing a field of view of a high-magnification mode camera unit in the one image pickup part.
Figure 14B:
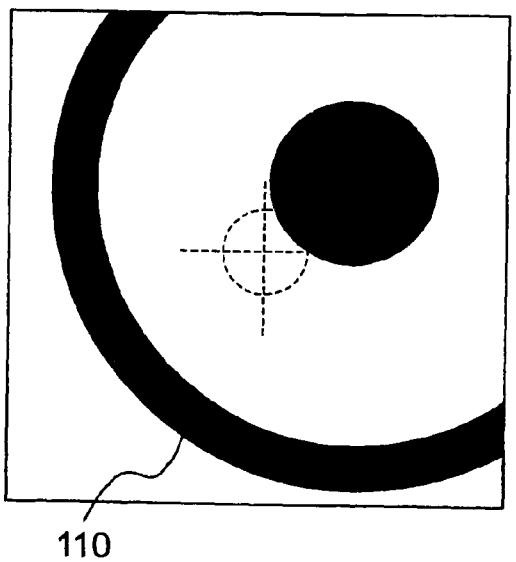
FIG. 14B is an explanatory view showing a field of view of a high-magnification mode camera unit in the other image pickup part.

Thereafter, after the completion of the coarse alignment and the movement of the high-magnification mode camera unit 98, the alignment mark 110 is minutely deviated in the field of view of the high-magnification mode camera unit 98 as shown in FIGS. 14A and 14B. FIG. 14A shows a field of view of the high-magnification mode camera unit 98 of one image pickup part 90, while FIG. 14B shows a field of view of the high-magnification mode camera unit 98 of the other image pickup part 90.

As to the reason of the above deviations, with the field of view of the low-magnification mode camera unit 97, the image resolution is 13 μm and there is a possibility that an error of several tens of micrometers with a deviation of image detection included may occur. As a result, strict deviations could not be resolved even if the coarse alignment is executed.

Thereafter, as shown in FIG. 12, an image of the black dot inside the alignment mark 110 is picked up by the high-magnification mode camera unit 98 (S23), a centroidal position of the inner black dot is read, and alignment quantities that are values by which the substrate 10 should be moved are calculated from deviated directions and deviation quantities of the two marks from their reference position (S24). Based on the resulting alignment quantities, fine adjustment of the substrate 10 is executed by the attitude adjustment member 12 (S14).

It is noted here that the term, fine alignment, refers to moving the alignment mark 110 to the alignment reference position indicated by dotted cruciform lines as shown in FIGS. 14A and 14B.

In this fine adjustment, the image resolution is 0.6 μm, and thus at least 2 μm or lower alignment precision can be achieved.

Thereafter, although not indispensable, an image of the black dot inside the alignment mark 110 is picked up once again by the high-magnification mode camera unit 98 (S25), it is checked for precision whether or not any deviation has occurred (S26), thus the alignment being completed (S2).

Next, measurement of droplet landing positions by the observation camera 91 is explained with reference to FIGS. 15A and 15B.

The observation camera 91 is used to acquire information for execution of landing position correction in replacement of the ejecting elements 61 of the droplet ejecting sections 6, or to reconfirm the landing positions during the use of the ejecting elements 61. The observation camera 91 performs image pickup of any arbitrary position on the apparatus top surface as well as determination of the position with the arm part moving mechanisms 5 and the slide mechanism 92.

The image pickup position of the observation camera 91 is outputted by scales internally provided in the arm part moving mechanisms 5 and the slide mechanism 92.

Figure 15A:
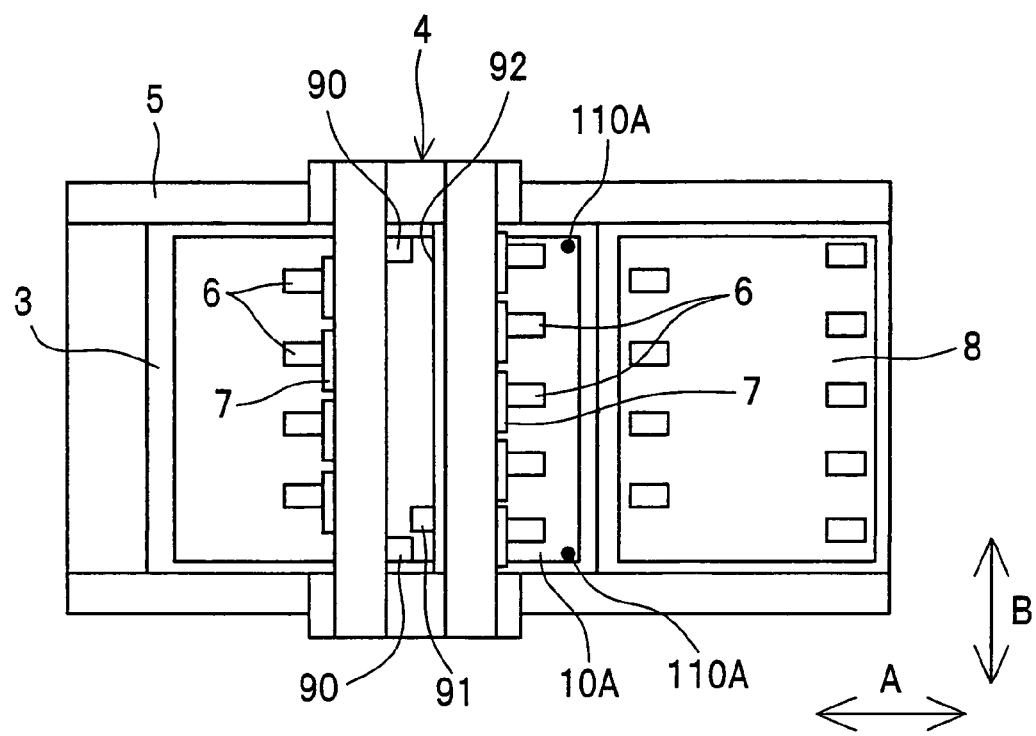
FIG. 15A is a function explanatory view showing measurement of droplet landing positions with an observation camera.

In the observation of droplet landing positions, a dummy substrate 10A on which specified alignment marks 110A similar to those of ordinary substrates 10 are given is carried as the substrate into the apparatus as shown in FIG. 15A, then subjected to substrate attitude control as it is normally done. The observation camera 91 picks up images of the two alignment marks 110A, 110A, respectively, on the dummy substrate 10A, by which their positional information is acquired.

Then, the arm part 4 is moved to an arbitrary position of the dummy substrate 10A. Droplets are ejected from the nozzle openings of the individual droplet ejecting sections 6 toward the dummy substrate 10A. In this operation, droplets may be ejected from all the nozzle openings.

In the individual droplet ejecting sections 6, virtual landing positions (ideal landing positions) are recognized by the scales contained in the arm part moving mechanisms 5 and the slide mechanism 92.

Figure 15B:
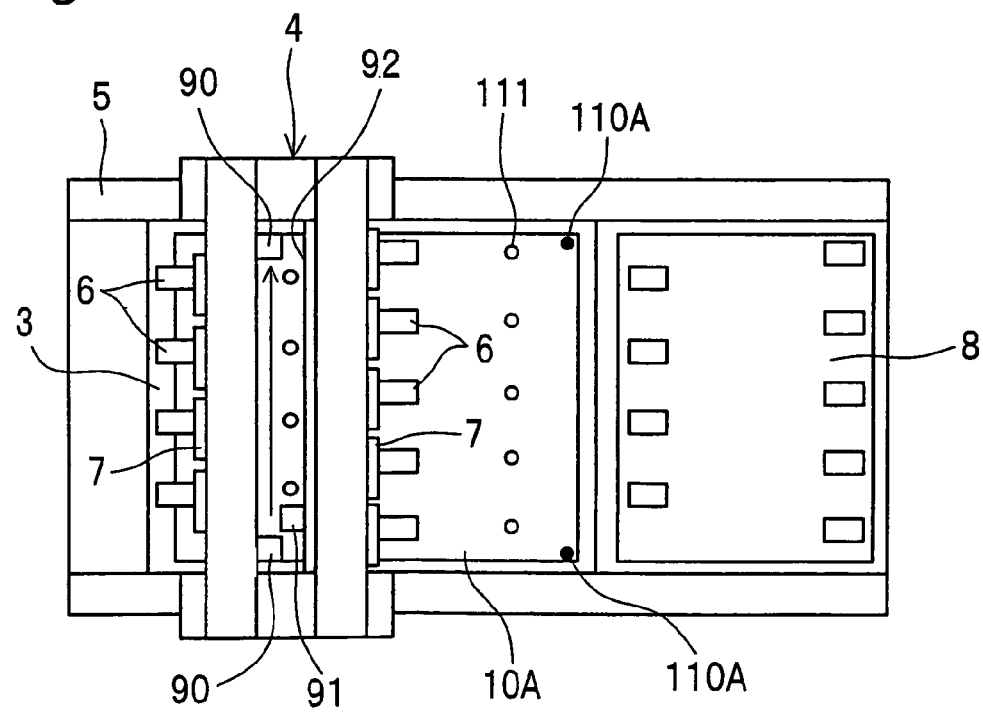
FIG. 15B is a function explanatory view showing measurement of droplet landing positions with the observation camera.

Thereafter, as shown in FIG. 15B, the observation camera 91, while being moved by the arm part moving mechanisms 5 and the slide mechanism 92, picks up images of droplet landing positions 111 in succession to determine actual landing positions from the alignment marks 110A.

Then, deviations between the virtual landing positions and the actual landing positions are stored as correction data for the individual droplet ejecting sections 6, respectively. These deviations are factorized into the arrow A direction and the arrow B direction.

Since the droplet ejection from the droplet ejecting sections 6 is performed with the arm part 4 kept moving in the arrow A direction, deviations in the arrow A direction can be corrected by adjusting the ejection timing of the droplet ejecting sections 6. Deviations in the arrow B direction are corrected by offset of moving amounts of the slide mechanisms 7. These operations may include detection of non-ejecting nozzle for each nozzle or detection of landing variations.

Figure 16A:
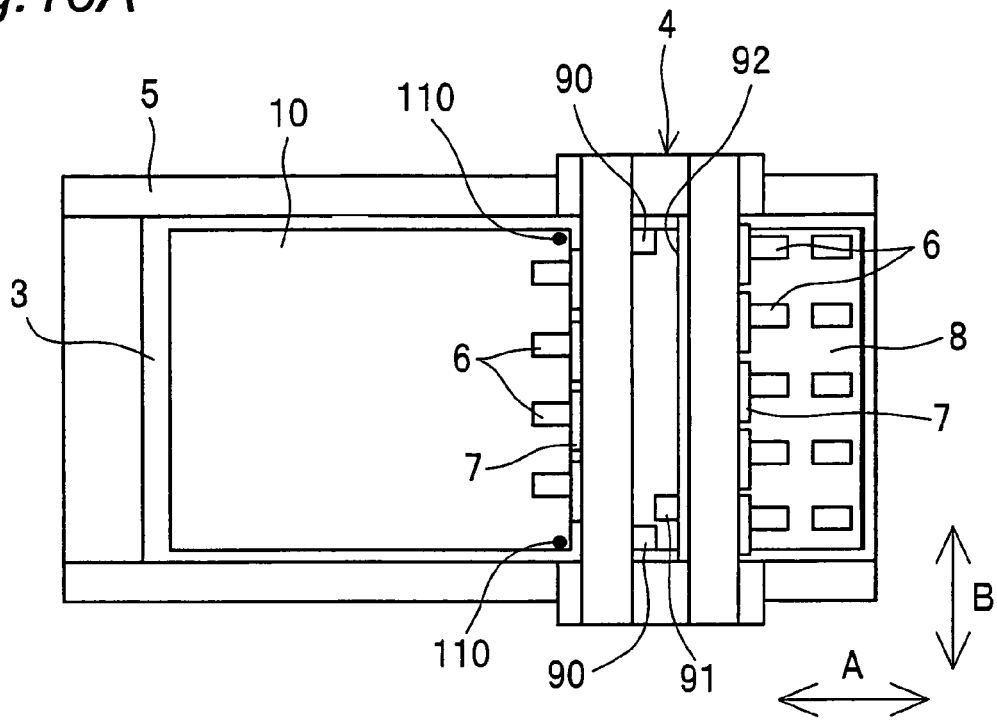
FIG. 16A is a function explanatory view showing a state that an arm part has moved rightmost in a drawing sheet in the process of droplet dropping to the substrate.
Figure 16B:
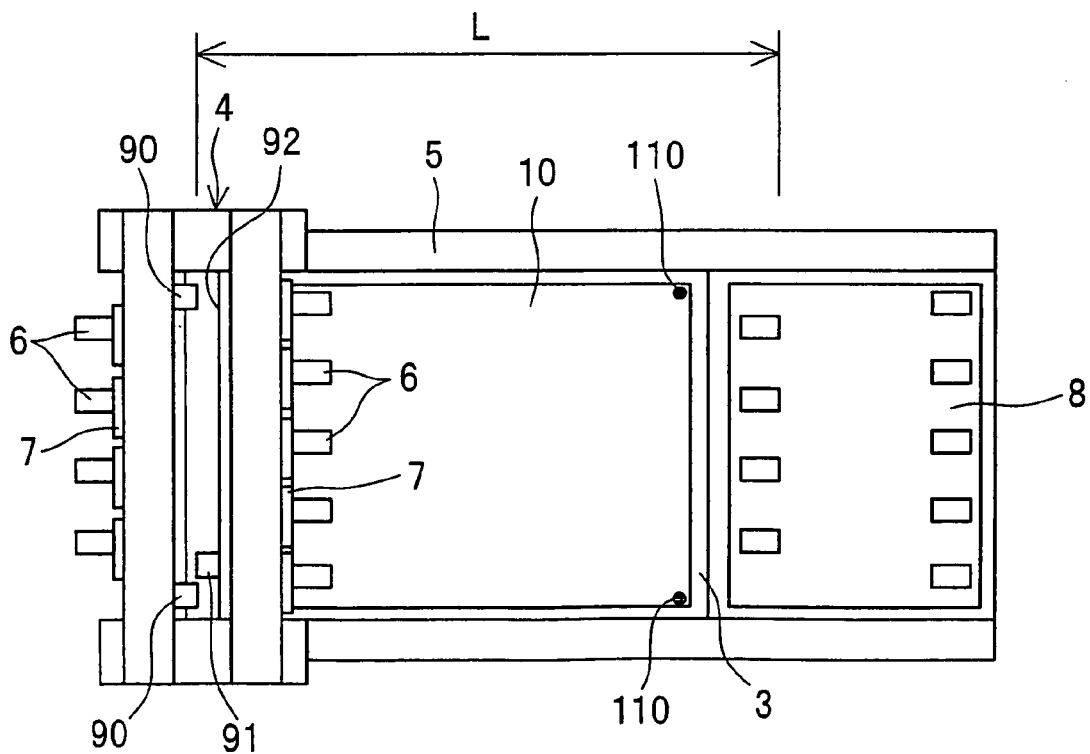
FIG. 16B is a function explanatory view showing a state that the arm part has moved leftmost in a drawing sheet in the process of droplet dropping to the substrate.

Next, the method of dropping droplets to desired positions referenced by alignment marks on the substrate 10 that has been completely attitude-controlled is explained with reference to FIGS. 16A and 16B. FIG. 16A shows a state that the arm part 4 has moved rightmost in the drawing sheet in the process of droplet dropping to the substrate 10. FIG. 16B shows a state that the arm part 4 has moved leftmost in the drawing sheet in the process of droplet dropping to the substrate 10. The arm part 4 reciprocates one to plural times over a range of a length L in the arrow A direction.

The plurality of droplet ejecting sections 6 mounted on the arm part 4 are movable in the arrow B direction independently of one another. The arm part 4 is reciprocatively moved in the arrow A direction on the substrate 10.

Before execution of the droplet ejecting operation, the individual droplet ejecting sections 6 are moved to addresses in the arrow B direction, which are desired positions, and stopped there. Then, during the reciprocative movement of the arm part 4 in the arrow A direction, droplets are ejected at a time point when addresses in the arrow A direction and the arrow B direction have become coincident with those of the desired positions. This operation is controlled for the plurality of droplet ejecting sections 6 independently of one another.

Next, the operation of ejecting droplets to the substrate 10 by the droplet ejecting sections 6 is explained with reference to FIG. 17.

On the arm part 4 are mounted the nine droplet ejecting sections 6 that are movable in the arrow B direction independently of one another. Assigned areas on the substrate 10 are set for the droplet ejecting sections 6, respectively.

While a plurality of defect portions 113 are present scatteredly on the substrate 10, the droplet ejecting sections 6 have their respective assigned areas zonally divided along the arrow B direction. A hatched area 114 in the figure is assigned to the first droplet ejecting section 6A. An area 115 is assigned to the second droplet ejecting section 6B. These respective droplet ejecting sections 6 perform droplet ejecting operation for the defect portions 113 present in the their respective assigned areas.

During the repeated reciprocative movement of the arm part 4 in the arrow A direction, the individual droplet ejecting sections 6 are moved in the arrow B direction independently so as to be moved to just above their assigned defect portions 113, respectively, and stopped at places of coincidence of addresses in the arrow B direction, keeping on standby until there comes coincidence of addresses in the arrow A direction by the movement of the arm part 4. Then, at a timing when the desired positions on the substrate 10 come just below, the droplet ejecting sections 6 are driven to eject droplets to the desired positions on the substrate 10.

Next, a process that the droplet ejecting sections 6 eject droplets to a plurality of the defect portions 113, which are rectangular-shaped recesses, during the reciprocative movement of the arm part 4 is explained with reference to FIGS. 18A to 18D. It is noted here that the term, defect portions 113, refers to portions where, with respect to portions having dust mixed in the manufacturing process, portions having blank dips formed therein, and the like, those failures are corrected into recesses of a certain shape by laser or the like.

On the assumption that all the droplet ejecting sections 6 eject one identical droplet material, a restoration method for defects of one kind of pixel (either one of red, blue or yellow) is described below. In addition, restoration of defect portions of all the colors is enabled by providing three units of this apparatus for the color materials, respectively, to perform successive processing, or by enabling such a droplet ejecting section 6A as shown in FIG. 7B to implement ejection of a plurality of colors.

FIGS. 18A to 18D are explanatory views regarding one of the plurality of droplet ejecting sections 6 mounted on the arm part 4 and showing, in time series, the execution of ejecting operation for a plurality of defect portions 113 from one droplet ejecting section 6.

Figure 18A:
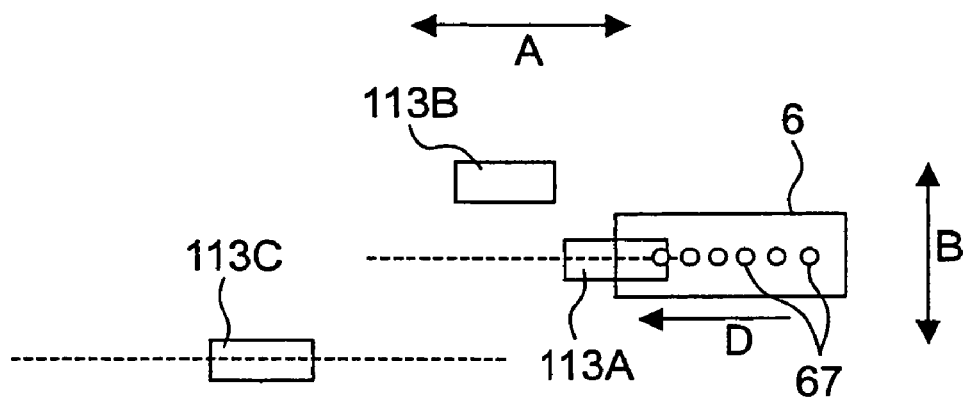
FIG. 18A is a function explanatory view showing an operation that droplets are ejected from the droplet ejecting section to defect portions.

As shown in FIG. 18A, defect portions 113A, 113B, 113C on the substrate are recess portions each having a depth of about 2 μm, their openings each having a roughly 200 μm×70 μm rectangular shape with its longer sides extending along the moving direction (arrow A direction) of the arm part 4. It is noted that the array direction of the nozzle openings 67 of the droplet ejecting section 6 is parallel to the arrow A direction, but actually inclined by a few degree as shown in FIG. 7A.

First, for ejection of droplets and restoration for the defect portion 113A, the droplet ejecting section 6 is moved at high speed by using the slide mechanism 7, and stopped with the nozzle openings 67 aligned on a center line of the defect portion 113A.

The time of movement of the droplet ejecting section 6 has to include, in addition to the time of actual movement, a settling time that elapses from the stop of the droplet ejecting section 6 until damping of residual vibrations due to the movement of the droplet ejecting section 6 to such a level that droplet ejection of the droplet ejecting section 6 is not adversely affected.

The droplet ejecting section 6, which has preliminarily been moved to above the center line of the defect portion 113A, is moved in an arrow D direction by constant-speed movement of the arm part 4 to eject droplets from the nozzle openings 67 located above the defect portion 113A.

For this operation, a plurality of nozzle openings 67 just above the defect portion 113A may be used, so that the speed of the constant-speed movement of the arm part 4 is raised, compared with the case where one nozzle opening 67 is used, making it possible to improve the processing speed for the substrate as a whole.

Figure 18B:
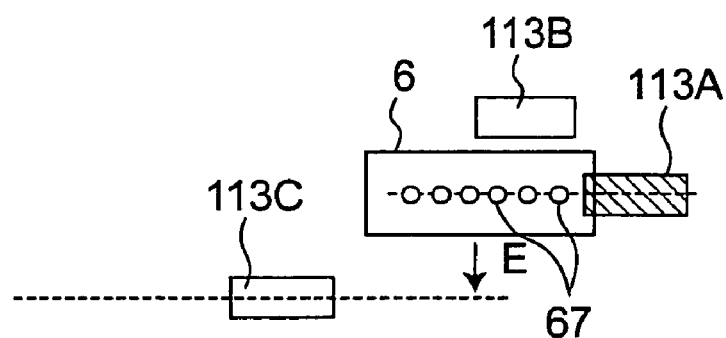
FIG. 18B is a function explanatory view showing an operation that droplets are ejected from the droplet ejecting section to defect portions.
Figure 18C:
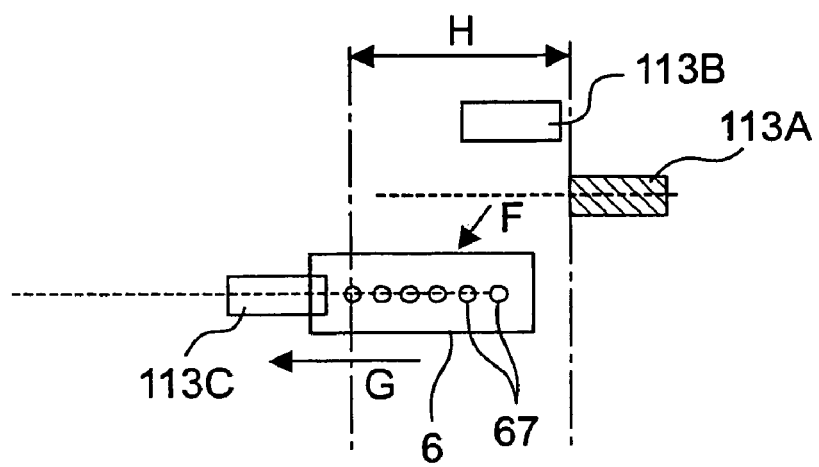
FIG. 18C is a function explanatory view showing an operation that droplets are ejected from the droplet ejecting section to defect portions.

Thereafter, the droplet ejecting section 6, which has ejected droplets onto the defect portion 113A, is moved in an arrow E direction by the slide mechanism 7 to restore another defect portion 113C as shown in FIG. 18B, being stopped at a position where the center line of the defect portion 113C and the array direction of the nozzle openings 67 coincide with each other. During this operation, since the arm part 4 is also moved leftward in the drawing sheet at a constant speed, the droplet ejecting section 6 is moved in an arrow F direction relative to the substrate 10 as shown in FIG. 18C.

Then, by the movement of the arm part 4, the droplet ejecting section 6, while being moved in an arrow G direction, ejects droplets from the nozzle openings 67 located just above the defect portion 113C to restore the defect portion 113C.

Figure 18D:
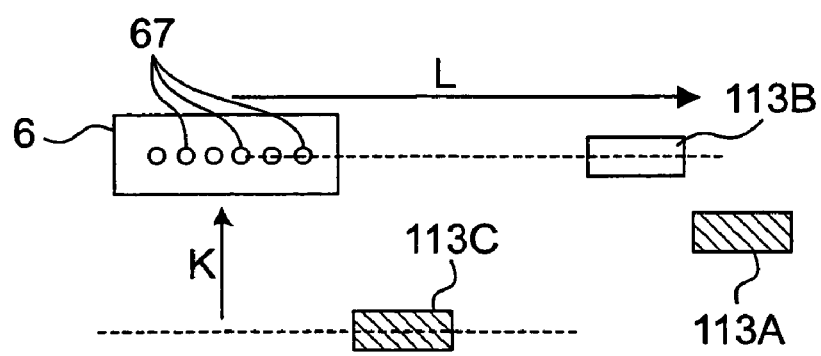
FIG. 18D is a function explanatory view showing an operation that droplets are ejected from the droplet ejecting section to defect portions.

After that, the arm part 4 starts to be moved in the opposite direction after the completion of one-direction movement. As shown in FIG. 18D, the droplet ejecting section 6 is moved in an arrow K direction by the slide mechanism 7 to restore yet another defect portion 113B, being stopped with the array direction of the nozzle openings 67 coincident with the center line of the defect portion 113B. Then, by movement of the arm part 4, the droplet ejecting section 6 is moved in an arrow L direction to eject droplets from the nozzle openings 67 located just above the defect portion 113B.

Consequently, by utilizing the reciprocating operation of the arm part 4, the restoration of the three defect portions 113A, 113B, 113C is carried out in an order of the defect portion 113A to the defect portion 113C to the defect portion 113B, with the best utilization of advantages of this apparatus construction.

That is, as shown in FIGS. 18A to 18D, for the ejection to the defect portion 113A with a plurality of nozzle openings 67, the droplet ejecting section 6 cannot be moved until the rightmost nozzle opening 67, as in the drawing sheet, that actually performs the ejection comes away from just above the defect portion 113A. At least in a region corresponding to the end-to-end distance of the nozzle openings 67 to be used, the droplet ejecting section 6 cannot be moved in the up/down direction, as in the drawing sheet, so as to be directed toward restoration of the next defect portion.

That is, the unmanageable region H includes a zonal region corresponding to the end-to-end distance of the in-use nozzle openings 67 from an end of the defect portion immediately after the processing, as well as a region resulting from multiplying the moving speed of the arm part 4 by a sum of the time required for the movement in the arrow E direction and the time required for the settling of residual vibrations after the movement.

As shown in FIG. 18C, since the defect portion 113B is contained in the unmanageable region H for the defect portion 113A, the processing of the defect portion 113B is not performed immediately after the restoration of the defect portion 113A, but the restoration of the defect portion 113C that does not belong to the unmanageable region H is performed.

Then, as the returning movement of the arm part 4 goes, the restoration of the defect portion 113B that does not belong to an unmanageable region H is performed after the restoration of the defect portion 113C.

Although the movement operation as to one droplet ejecting section 6 has been described above, the apparatus has a plurality of droplet ejecting sections 6, which operate independently of one another.

Next, a procedure for restoring pixels of the defect portions 113 by the droplet ejecting section 6A that ejects a plurality of droplet materials shown in FIG. 7B is explained with reference to FIGS. 19A to 19C and FIGS. 20A to 20C.

Figure 19A:
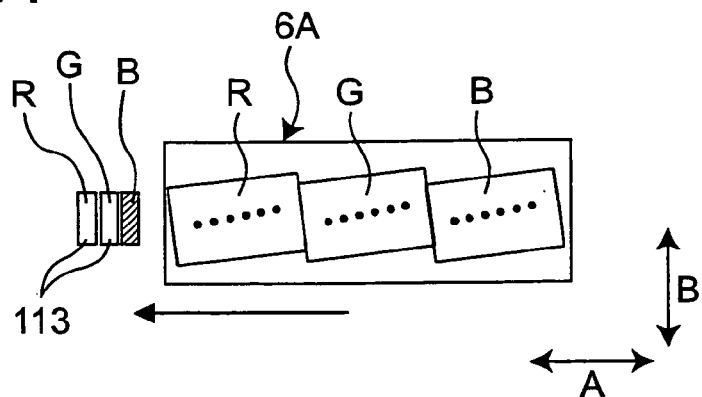
FIG. 19A is a function explanatory view showing recovery of a defect portion under a condition that a pixel longitudinal direction of a defect portion is perpendicular to an arm part moving direction.
Figure 19B:
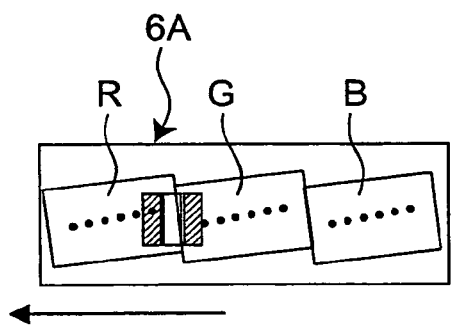
FIG. 19B is a function explanatory view showing recovery of a defect portion under a condition that a pixel longitudinal direction of a defect portion is perpendicular to the arm part moving direction.
Figure 19C:
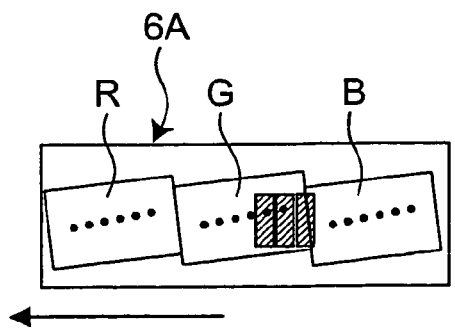
FIG. 19C is a function explanatory view showing recovery of a defect portion under a condition that a pixel longitudinal direction of a defect portion is perpendicular to the arm part moving direction.

First, restoration of a defect portion 113 is described on a case where, as shown in FIGS. 19A to 19C, a pixel longitudinal direction of the defect portion 113 is a direction perpendicular to the moving direction of the arm part 4.

As shown in FIG. 19A, in the event of occurrence of pixels showing no desired color due to color mixing of R and G pixels caused by dust or the like during the manufacturing process, the resulting portion is removed by laser in a rectangular shape, so that a recess portion, which is the defect portion 113, is formed. Then, the droplet ejecting section 6A is moved in one way of the arrow A direction.

Thereafter, as shown in FIG. 19B, a droplet is dropped to a defect portion 113 of the R pixel by the droplet ejecting section 6A. Further, as shown in FIG. 19C, a droplet is dropped to a defect portion 113 of the G pixel by the droplet ejecting section 6A.

Figure 20A:
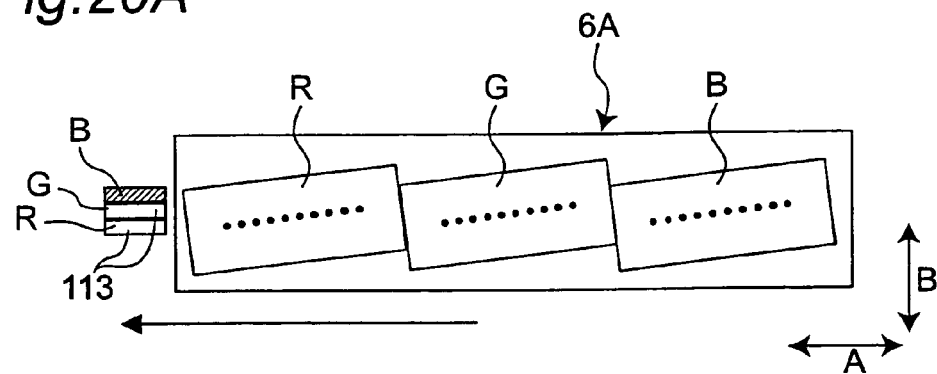
FIG. 20A is a function explanatory view showing recovery of a defect portion under a condition that a pixel longitudinal direction of a defect portion is the arm part moving direction.
Figure 20B:
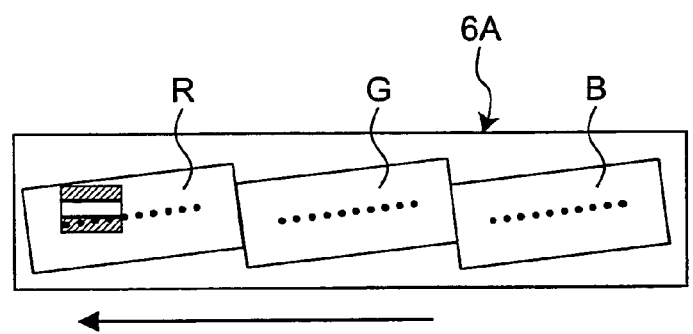
FIG. 20B is a function explanatory view showing recovery of a defect portion under a condition that a pixel longitudinal direction of a defect portion is the arm part moving direction.
Figure 20C:
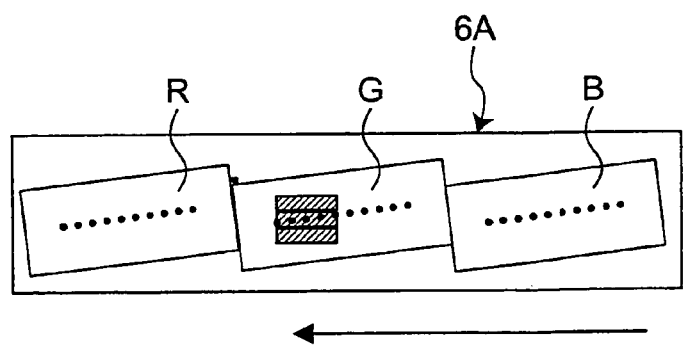
FIG. 20C is a function explanatory view showing recovery of a defect portion under a condition that a pixel longitudinal direction of a defect portion is the arm part moving direction.

Next, restoration of the defect portion 113 is described on a case where, as shown in FIGS. 20A to 20C, a pixel longitudinal direction of the defect portion 113 is the moving direction of the arm part 4.

As shown in FIG. 20A, in the event of occurrence of pixels showing no desired color due to color mixing of R and G pixels caused by dust or the like during the manufacturing process, the resulting portion is removed by laser in a rectangular shape, so that a recess portion, which is the defect portion 113, is formed. Then, the droplet ejecting section 6A is moved in one way of the arrow A direction.

Thereafter, as shown in FIG. 20B, a droplet is dropped to a defect portion 113 of the R pixel by the droplet ejecting section 6A. Further, as shown in FIG. 20C, a droplet is dropped to a defect portion 113 of the G pixel by the droplet ejecting section 6A.

According to the droplet applying apparatus having the above-described construction, since the droplet applying apparatus includes the arm part 4 movable relative to the base 11 and the plurality of droplet ejecting sections 6 movably fitted to the arm part 4, it becomes implementable, in the application of droplets to specified portions (e.g., coloring failure portions) of the substrate 10 by the droplet ejecting sections 6, to execute the droplet application by moving the arm part 4 or the droplet ejecting sections 6, so that the droplets can be applied to the specified portions of the substrate 10 with high efficiency.

Also, the quantity of the droplet ejecting sections 6 can be reduced to a necessary minimum, so that the quantity of non-operating droplet ejecting sections 6 can be cut down. Accordingly, clogging of the droplet ejecting sections 6 by droplets can be prevented, the liquid quantity of waste fluid due to the maintenance operation of the droplet ejecting sections 6 can be reduced, and moreover the ejection quantity of all the droplet ejecting sections 6 can be uniformized.

Also, the beam members 41, 42 have a plurality of flat surfaces extending in the arrow B direction, respectively, and the droplet ejecting sections 6 are fitted on one flat surface out of the plurality of flat surfaces in each of the beam members 41, 42. Therefore, it becomes easy to obtain high positional precision of the one flat surface relative to the mounting surface 11a, so that the precision of droplet landing positions by the droplet ejecting sections 6 relative to the substrate 10 can be improved.

In contrast to this, in a case where the droplet ejecting sections 6 are fitted on two flat surfaces out of the plurality of flat surfaces in each of the beam members 41, 42, it is difficult to obtain high positional precision of the two flat surfaces relative to the mounting surface 11a from the viewpoints of machining of each of the beam members 41, 42, fitting of the beam members 41, 42, and the like. This would lead to a problem that the precision of droplet landing positions by the droplet ejecting sections 6 relative to the substrate 10 is worsened.

More specifically, the beam members 41, 42 are 2 m or more long in the arrow B direction, which makes it difficult to obtain allowable two-surface accuracy out of the four surfaces of each of the beam members 41, 42. It is also quite difficult to ensure the parallelism of the confronting two surfaces of each of the beam members 41, 42.

Figure 21A:
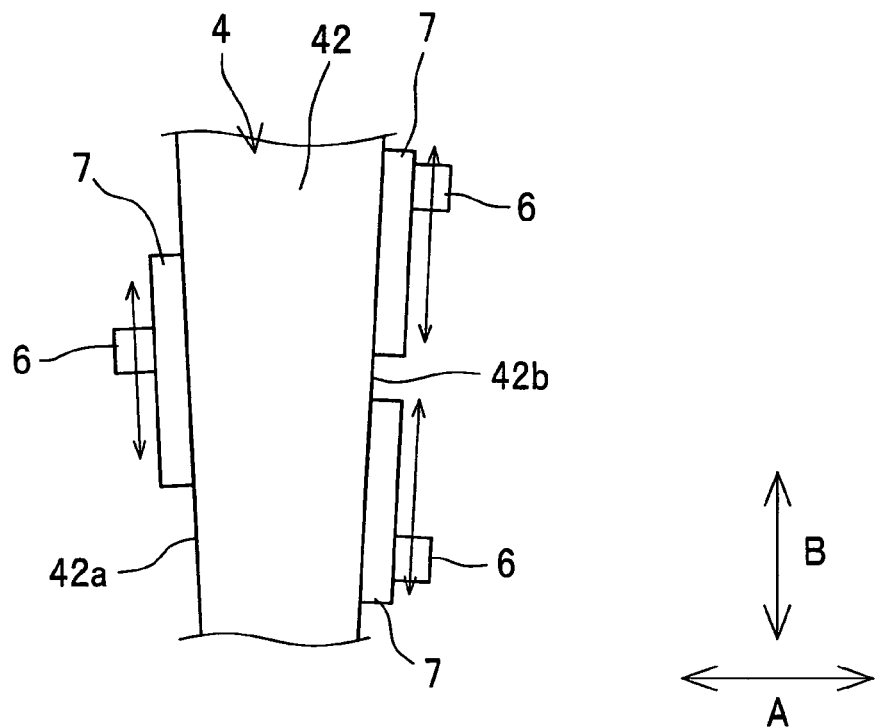
FIG. 21A is a plan view showing a comparative example of a beam member.

Assuming that the droplet ejecting sections 6 are mounted on two surfaces, i.e. the confronting surface 42a and the fitting surface 42b of the second beam member 42, as shown in FIG. 21A, slide loci of the droplet ejecting sections 6 do not become parallel due to non-parallelism between the confronting surface 42a and the fitting surface 42b.

Figure 21B:
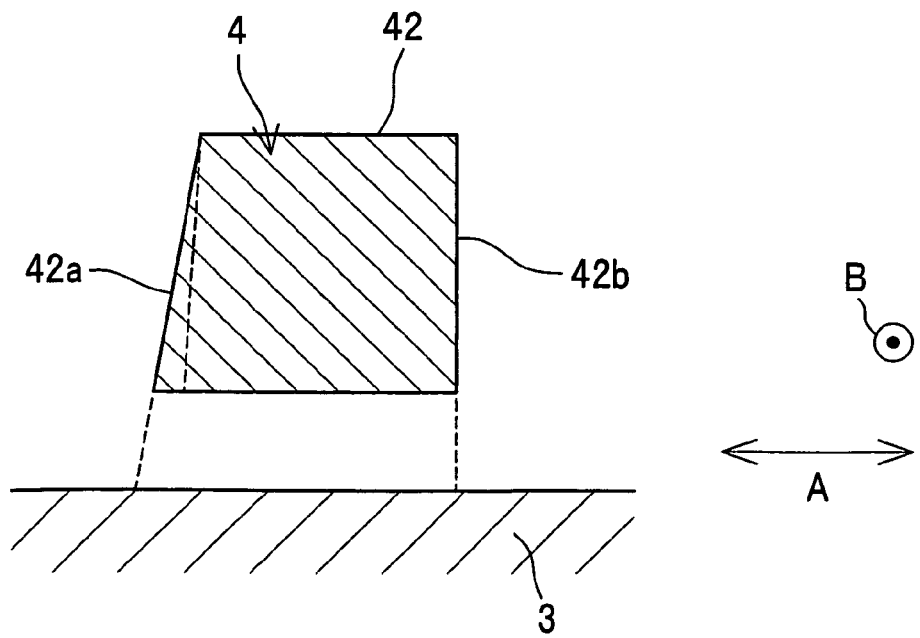
FIG. 21B is a sectional view showing the comparative example of the beam member.

Also as shown in FIG. 21B, on condition that the fitting surface 42b is set vertical to the mounting stage 3, the confronting surface 42a would not be vertical and, in the worst case, its inclination angle would vary over the arrow B direction. It is noted here that variation in the inclination angle over the arrow B direction means that the confronting surface 42a shown in FIG. 21B becomes as indicated by solid line on the front side in the drawing sheet and does as indicated by broken line in FIG. 21B on the depth side as viewed in the drawing sheet.

Then, in order to parallelize the slide loci of the droplet ejecting sections 6 on the confronting surface 42a, there is a need for attaching an unshown adjustment member between the confronting surface 42a and the slide mechanism 7, taking time and labor.

The droplet ejecting section 6 particularly for use in a manufacturing apparatus weighs at least several kilograms or more, being a heavyweight member as compared with the observation camera 91. Therefore, even if the inclination angle can be corrected by the adjustment member, the slide mechanism 7 would be lower in attachment rigidity, so that sliding the weighty droplet ejecting section 6 would result in unstable moving loci. As a result, there has been a fear that the landing precision is worsened.

On the other hand, in the droplet applying apparatus of the invention, with respect to one beam member 41 or 42, the slide mechanism 7 and the droplet ejecting sections 6 are fitted only on longitudinal one surface (fitting surfaces 41b, 42b) of the beam members 41, 42. Therefore, the fitting surface 41b, 42b can be made generally vertical to the surface of the substrate 10 and generally parallel to the arrow B direction.

Further, according to the droplet applying apparatus having the above-described construction, since the two beam members 41, 42 are provided side by side in the arrow A direction, the droplet ejecting sections 6 that can be mounted on this apparatus can be increased in quantity, so that the processing time for the substrate 10 can be shortened.

The two beam members 41, 42 are integrally coupled to each other and integrally movable relative to the base 11 in the arrow A direction. Therefore, moving mechanisms for moving the beam members 41, 42 and the base 11 relative to each other can be decreased in quantity. Also, vibrations (resonance) that may occur when the two beam members 41, 42 are moved independently of each other relative to the base 11 can be prevented, by which any shifts of droplet landing positions due to the vibrations can be prevented.

The image pickup parts 90 and the observation camera 91 fitted to the beam members 41, 42 are provided between the neighboring beam members 41, 42. Therefore, the image pickup parts 90 and the observation camera 91 can be positioned in a dead space between the neighboring beam members 41, 42, and moreover no additional beam member needs to be provided for fitting of the image pickup parts 90 and the observation camera 91. Thus, the apparatus can be reduced in size.

The image pickup parts 90 and the observation camera 91 are fitted on the confronting surfaces 41a, 42a, which have difficulty in obtaining allowable surface accuracy. However, since the image pickup parts 90 are fixed without movement relative to the beam member 41, positional adjustment of the image pickup parts 90 can easily be achieved, while the observation camera 91 can be subjected to positional correction by preparatorily measuring shifts of its own moving locus.

An unshown adjustment member may also be attached between the confronting surface 42a and the slide mechanism 92 of the observation camera 91 so as to ensure the parallelism with the fitting surface 42b. In this case, although time and labor is required for adjustment, yet the observation camera 91 is a lightweight member (generally, 2 kg or less) as compared with the droplet ejecting sections 6, so that there is no fear that movement of the observation camera 91 on the slide mechanism 92 may cause any observation shifts.

That is, the image pickup parts 90 and the observation camera 91, which are easier to adjust than the droplet ejecting sections 6, may be fitted, without any problem, on the confronting surfaces 41a, 42a, which have difficulty in obtaining precision.

The droplet ejecting sections 6 are fitted on the fitting surface 41b of the first beam member 41 and the fitting surface 42b of the second beam member 42. That is, the droplet ejecting sections 6 are fitted on outer flat surfaces of the integrally coupled two beam members 41, 42 that are on the outer side in the arrow A direction. Therefore, fitting and removal, maintenance, and other working processes of the droplet ejecting sections 6 can easily be executed from the outer side of the two beam members 41, 42.

Also, the droplet ejecting sections 6 are fitted on side faces of the beam members 41, 42. Therefore, with the use of such slide mechanisms as the LM guides 70 for the beam members 41, 42, the slide mechanisms are normally kept one-side pressed by self weights of the droplet ejecting sections 6, so that the droplet ejecting sections 6 can be slid while rattling or vibrations are reduced. Thus, stable landing positions can be obtained.

The present invention is not limited to the above-described embodiment. For example, with use of beam members having a plurality of flat surfaces extending along the arrow B direction, the droplet ejecting sections 6 may be fitted on one flat surface out of the plurality of flat surfaces.

The droplet ejecting sections 6 may also be fitted on upper surfaces of the beam members 41, 42 via L-shaped fitting members or the like. Self weights of the droplet ejecting sections 6 act to reduce rattling of the droplet ejecting sections 6 in their running, by which the landing position precision of droplets is improved and moreover the fitting and removal of the droplet ejecting sections 6 to and from the beam members 41, 42 can be achieve more easily.

The number of the beam members 41, 42 may be freely increased or decreased. When a plurality of beam members are provided, these plurality of beam members are placed side by side along the arrow A direction.

Image pickup devices other than the image pickup parts 90 or the observation camera 91 may also be used as the image pickup parts. The image pickup parts 90 may be provided by one camera unit which is switched between a high-magnification mode and a low-magnification mode by zooming. Further, the image pickup parts 90 may be so designed that observations by high and low magnifying powers can be implemented at the same time by means of optical path division. More specifically, light from the substrate 10 may be split so as to be led to two CCDs having different pixel counts.

The moving direction of the droplet ejecting sections 6 and the moving direction of the arm part 4 may be other than perpendicular to each other, as viewed in a plane. It is also allowed that the arm part 4 is stationary while the mounting stage 3 is movable.

The droplet ejecting sections 6 may be so designed as to eject droplets to the entire surface of the substrate 10. Also, the number of the droplet ejecting sections 6 may be freely increased or decreased.

The droplet applying apparatus of the invention is applied to apparatuses that perform restoration of defect portions of a color filter substrate hereinabove. However, the droplet applying apparatus may also be applied to other apparatuses that perform ejection to desired points scattered on the substrate. For example, the invention apparatus is also applicable to apparatuses that eject electrically conductive ink onto the substrate to draw interconnect patterns, apparatuses that eject materials for formation of organic EL (Electronic Luminescence) on the substrate to manufacture organic EL displays, apparatuses that restore defect portions of organic EL displays, apparatuses that print images on large-size signboards or the like, apparatuses that restore images, or other manufacturing apparatuses to which the ink jet technology is applied.

The invention claimed is:

1. A droplet applying apparatus comprising:
a base having a mounting surface on which a substrate is mounted;
first and second beam members which confront the mounting surface and extend in one direction of the mounting surface and which are fitted to the base so as to be movable relative to the base in the other direction of the mounting surface, wherein the first and second beam members are arrayed side by side in the other direction; and
a plurality of droplet ejecting sections which are fitted to the first and second beam members so as to be movable in the one direction and which eject and apply droplets to the substrate, and
at least one image pickup device which is placed between the first and second beam members and fitted to at least one of the first and second beam members and which serves for picking up an image of the substrate mounted on the mounting surface; wherein
the first and second beam members are integrally coupled together so as to be integrally movable relative to the base in the other direction, and wherein
each of the first and second beam members has both a fitting surface and a confronting surface, the fitting surface and the confronting surface being flat surfaces, extending in one direction and facing opposite sides in the other direction, respectively, and wherein
the droplet ejecting sections are fitted on the fitting surface of the first beam member opposite to the confronting surface of the first beam member confronting the second beam member as well as on the fitting surface of the second beam member opposite to the confronting surface of the second beam member confronting the first beam member; and wherein
the at least one image pickup device is fitted to at least one of the confronting surfaces of the first and second beam members.

2. The droplet applying apparatus as claimed in claim 1, wherein
the image pickup device includes image pickup parts which detect alignment marks of the substrate mounted on the mounting surface.

3. The droplet applying apparatus as claimed in claim 1, wherein
an image pickup device includes an observation camera observing a landing image of droplets ejected by the droplet ejecting sections landing on the substrate; wherein
the observation camera is movably fitted to one of the confronting surfaces of the first and second beam member, the observation camera being movable in the one direction.

4. The droplet applying apparatus as claimed in claim 1, wherein
a plurality of slide mechanisms are fitted to the fitting surfaces of the first and second beam members, the slide mechanisms moving the droplet ejecting sections in one direction, respectively, and wherein
the slide mechanisms are spaced from one another and arranged in a zigzag pattern as viewed from above the base.

* * * * *